(12) United States Patent
Yoon

(10) Patent No.: US 8,958,257 B2
(45) Date of Patent: Feb. 17, 2015

(54) SEMICONDUCTOR MEMORY DEVICE

(76) Inventor: Jae Man Yoon, Gyeonggi-Do (KR)

( * ) Notice: Subject to any disclaimer, the term of this patent is extended or adjusted under 35 U.S.C. 154(b) by 0 days.

(21) Appl. No.: 13/808,252

(22) PCT Filed: Jan. 7, 2011

(86) PCT No.: PCT/KR2011/000102
§ 371 (c)(1),
(2), (4) Date: Jan. 3, 2013

(87) PCT Pub. No.: WO2012/005426
PCT Pub. Date: Jan. 12, 2012

(65) Prior Publication Data
US 2013/0107652 A1    May 2, 2013

(30) Foreign Application Priority Data

Jul. 8, 2010  (KR) .................. 10-2010-0066051
Dec. 23, 2010  (KR) .................. 10-2010-0133710

(51) Int. Cl.
*G11C 7/02*      (2006.01)
*G11C 7/06*      (2006.01)
(Continued)

(52) U.S. Cl.
CPC  *G11C 7/06* (2013.01); *G11C 5/063* (2013.01); *G11C 5/025* (2013.01); *G11C 11/4094* (2013.01); *G11C 11/4097* (2013.01); *G11C 11/4074* (2013.01)
USPC ...................................... 365/207; 365/189.05

(58) Field of Classification Search
CPC .............................. G11C 7/22; G11C 11/4091
USPC ............................................ 365/207, 189.05
See application file for complete search history.

(56) References Cited

U.S. PATENT DOCUMENTS 7,633,789 B2 * 12/2009  Norman ..................... 365/148
8,258,496 B2 *  9/2012  Toda et al. ..................... 257/5
(Continued)

FOREIGN PATENT DOCUMENTS

CN       101533668 A      9/2009
KR   10-2005-0107813 A   11/2005
(Continued)

OTHER PUBLICATIONS

International Search Report, PCT/KR2011/000102, dated Sep. 15, 2011.
(Continued)

*Primary Examiner* — Michael Tran
(74) *Attorney, Agent, or Firm* — Nixon Peabody LLP

(57) ABSTRACT

A semiconductor memory device including a memory cell array including at least one word line, at least one cell bit line, and at least one memory cell that is disposed in a region where the at least one word line and the at least one cell bit line cross each other; at least one sense amplifier that is disposed above or below the memory cell array to be overlapped with the memory cell array in a planar fashion, connected to at least one bit line connected to the at least one cell bit line, and at least one complementary bit line corresponding to the at least one bit line, and senses data stored in the at least one memory cell; a decompression unit for decompressing a signal having a lower voltage level from among a signal of the at least one bit line and a signal of the at least one complementary bit line; a boosting unit for boosting a signal having a higher voltage level from among the signal of the at least one bit line and the signal of the at least one complementary bit line; and an equalizing unit for equalizing the signal of the at least one bit line and the signal of the at least one complementary bit line.

16 Claims, 35 Drawing Sheets

(51) Int. Cl.
  *G11C 5/06* (2006.01)
  *G11C 5/02* (2006.01)
  *G11C 11/4094* (2006.01)
  *G11C 11/4097* (2006.01)
  *G11C 11/4074* (2006.01)

(56) References Cited

U.S. PATENT DOCUMENTS

2008/0068908 A1* 3/2008 Kim .............................. 365/203
2008/0080282 A1* 4/2008 Chang .......................... 365/205
2008/0180982 A1* 7/2008 Nejad et al. ................... 365/63
2009/0285012 A1* 11/2009 Dittrich ........................ 365/158

FOREIGN PATENT DOCUMENTS

KR       10-0639752 B1    10/2006
KR    10-2007-0096972 A   10/2007
WO         98/45130 A1    10/1998

OTHER PUBLICATIONS

Written Opinion of the International Searching Authority, PCT/KR2011/000102, dated Sep. 15, 2011.

Office Action in Chinese application No. 201180033923.1, dated Jun. 26, 2014.

* cited by examiner

SEMICONDUCTOR MEMORY DEVICE

CROSS REFERENCE TO RELATED APPLICATIONS OR PRIORITY CLAIM

This application is a National Phase of PCT/KR2011/000102, filed Jan. 7, 2011, entitled, "SEMICONDUCTOR MEMORY DEVICE", which claims the benefit of Korean Patent Application No. 10-2010-0066051, filed Jul. 8, 2010 and Korean Patent Application No. 10-2010-0133710, filed on Dec. 23, 2010, the contents of which are incorporated herein by reference in their entirety.

TECHNICAL FIELD

The present invention relates to a semiconductor memory device, and more particularly, to a semiconductor memory device having a structure in which a memory cell array and a sense amplifier are overlapped with each other in a planar fashion.

BACKGROUND ART

Semiconductor memory devices storing data may be classified into a volatile memory device and a non-volatile memory device. The volatile memory device loses stored data when power supply is stopped, while the non-volatile memory device maintains stored data even when power supply is stopped.

DETAILED DESCRIPTION OF THE INVENTION

Technical Problem

The present invention provides a semiconductor memory device capable of increasing integration by reducing an area of a semiconductor device, a memory card including the semiconductor memory device, and an electronic system including the semiconductor memory device.

Technical Solution

According to an aspect of the present invention, there is provided a semiconductor memory device including: a memory cell array including at least one word line, at least one cell bit line, and at least one memory cell that is disposed in a region where the at least one word line and the at least one cell bit line cross each other; at least one sense amplifier that is disposed above or below the memory cell array to be overlapped with the memory cell array in a planar fashion, is connected to at least one bit line connected to the at least one cell bit line and at least one complementary bit line corresponding to the at least one bit line, and senses data stored in the at least one memory cell, wherein the sense amplifier includes: a decompression unit for decompressing a signal having a lower voltage level from among a signal of the at least one bit line and a signal of the at least one complementary bit line; a boosting unit for boosting a signal having a higher voltage level from among the signal of the at least one bit line and the signal of the at least one complementary bit line; and an equalizing unit for equalizing the signal of the at least one bit line and the signal of the at least one complementary bit line.

The at least one cell bit line may extend in a first direction, and the at least one word line, the at least one bit line, and the at least one complementary bit line may extend parallel to one another in a second direction perpendicular to the first direction.

The at least one sense amplifier may further include a loading capacitor connected to the complementary bit line.

The memory cell array may further include at least one first sense amplifier control line that provides a plurality of control signals to the at least one sense amplifier and extends in the first direction.

The memory cell array may further include at least one additional memory cell disposed in a region where the at least one first sense amplifier control line and the at least one word line cross each other.

The memory cell array may further include at least one second sense amplifier control line that is connected to the at least one first sense amplifier control line and extends in the second direction.

The memory cell array may further include at least one complementary cell bit line that is connected to the at least one complementary bit line and extends in the first direction, and one end of the at least one complementary cell bit line is floated.

The memory cell array may further include at least one first sense amplifier control line that provides at least one control signal to the at least one sense amplifier and extends in the first direction.

The memory cell array may further include at least one additional memory cell that is disposed in a region where the at least one first sense amplifier control line and the at least one word line cross each other.

The memory cell array may further include at least one second sense amplifier control line that is connected to the at least one first sense amplifier control line and extends in the second direction.

The memory cell array may further include at least one complementary cell bit line that is connected to the at least one complementary bit line and extends in the first direction, and one end of the at least one complementary cell bit line is floated, and wherein the at least one sense amplifier may further include a loading capacitor connected to the complementary bit line.

The memory cell array may further include at least one first sense amplifier control line that provides at least one control signal to the at least one sense amplifier and extends in the first direction.

The memory cell array may further include at least one additional memory cell that is disposed in a region where the at least one first sense amplifier control line and the at least one word line cross each other.

The memory cell array may further include at least one second sense amplifier control line that is connected to the at least one first sense amplifier control line and extends in the second direction.

The at least one cell bit line, the at least one bit line, and the at least one complementary bit line may extend parallel to one another in the first direction, and the at least one word line may extend in the second direction perpendicular to the first direction.

The at least one sense amplifier may further include a loading capacitor connected to the complementary bit line.

The memory cell array may further include at least one first sense amplifier control line that provides at least one control signal to the at least one sense amplifier and extends in the first direction.

The memory cell array may further include at least one second sense amplifier control line that is connected to the at least one first sense amplifier control line and extends in the second direction.

The memory cell array may further include at least one complementary cell bit line that is connected to the at least one complementary bit line and extends in the first direction, and one end of the at least one complementary cell bit line may be floated.

The at least one cell bit line may be a plurality of cell bit lines, and the at least one sense amplifier may further include a selecting unit that is connected to at least two cell bit lines from among the plurality of cell bit lines and connects one of the at least two cell bit lines to the at least one bit line.

The selecting unit may include: a first switching device connected between one of the at least two cell bit lines and the at least one bit line and turned on/off according to a first selection signal; and a second switching device connected between the other one of the at least two cell bit lines and the at least one bit line and turned on/off according to a second selection signal.

The semiconductor memory device may further include at least one output element connected to the at least one sense amplifier so as not to be overlapped with the memory cell array and the at least one sense amplifier in a planar fashion, wherein the at least one output element transmits a signal of the at least one bit line to an output line.

The at least one sense amplifier may further include a precharging unit for precharging the at least one bit line to a precharge voltage.

According to another aspect of the present invention, there is provided a memory card including: a memory unit including the semiconductor memory device; and a controller for controlling the memory unit.

According to another aspect of the present invention, there is provided an electronic system including: a memory unit including the semiconductor memory device; a processor communicated with the memory unit via a bus; and an input/output device communicated with the bus.

BEST MODE

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The terminology used herein is for the purpose of describing particular embodiments only and is not intended to be limiting of the inventive concept. As used herein, the singular forms "a," "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the invention are described herein with reference to schematic illustrations of exemplary embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Expressions such as "at least one of," when preceding a list of elements, modify the entire list of elements and do not modify the individual elements of the list.

Figure 1:
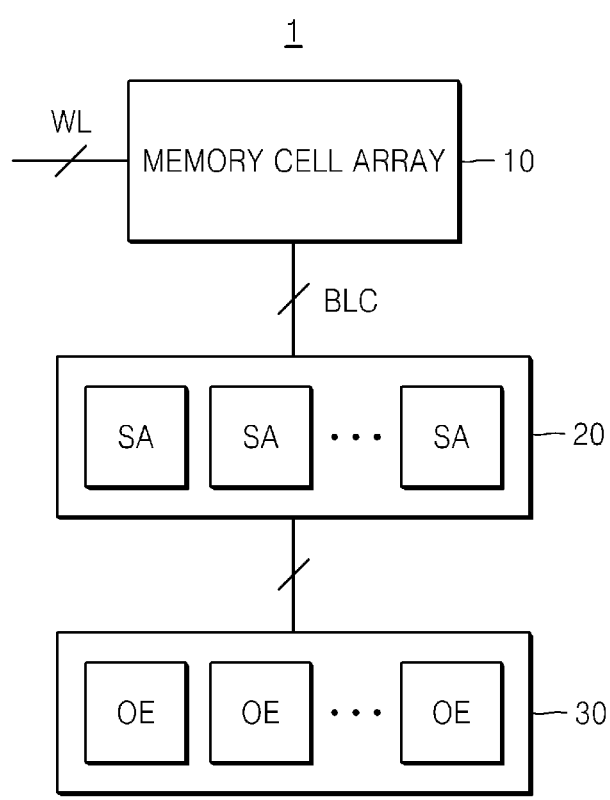
FIG. 1 is a schematic block diagram of a semiconductor memory device according to an embodiment of the present invention.

FIG. 1 is a schematic block diagram of a semiconductor memory device 1 according to an embodiment of the present invention.

Referring to FIG. 1, the semiconductor memory device 1 may include a memory cell array 10 and a sense amplifier block 20. The semiconductor memory device 1 may further include an output unit 30.

The memory cell array 10 may include a plurality of word lines WL, a plurality of cell bit lines BLC, and a plurality of memory cells MC that are respectively disposed in regions where the plurality of word lines WL and the plurality of cell bit lines BLC cross each other. Here, the memory cells MC may be volatile memory cells such as dynamic random access memories (DRAMs), may be resistive memory cells such as phase-change RAMs (PRAMs) and resistive RAMs (RRAMs), or may be nano floating gate memories (NFGMs), polymer RAMs (PoRAMs), magnetic RAMs (MRAMs), ferroelectric RAMs (FeRAMs), or flash memory cells.

The sense amplifier block 20 may include a plurality of sense amplifiers (SA). Each of the sense amplifiers SA may be connected to a bit line BL, which is connected to one of the cell bit lines BLC, and a complementary bit line BLB corresponding to the bit line BL. Here, the sense amplifier SA may be an open bit line sense amplifier, a folded bit line sense amplifier, an alternate sense amplifier, or a rotated sense amplifier. In the current embodiment, the sense amplifier block 20 may be disposed above or below the memory cell array 10 to be overlapped with the memory cell array 10 in a planar fashion.

The output unit 30 may include a plurality of output elements OE that may be respectively connected to the cell bit lines BLC. Here, each of the output elements OE may transmit a signal of the corresponding bit line BL to an output line. In the current embodiment, the output unit 30 may be disposed at the side of the memory cell array 10 or the sense amplifier block 20 so as not to be overlapped with the memory cell array 10 and the sense amplifier block 20 in a planar fashion.

Figure 2:
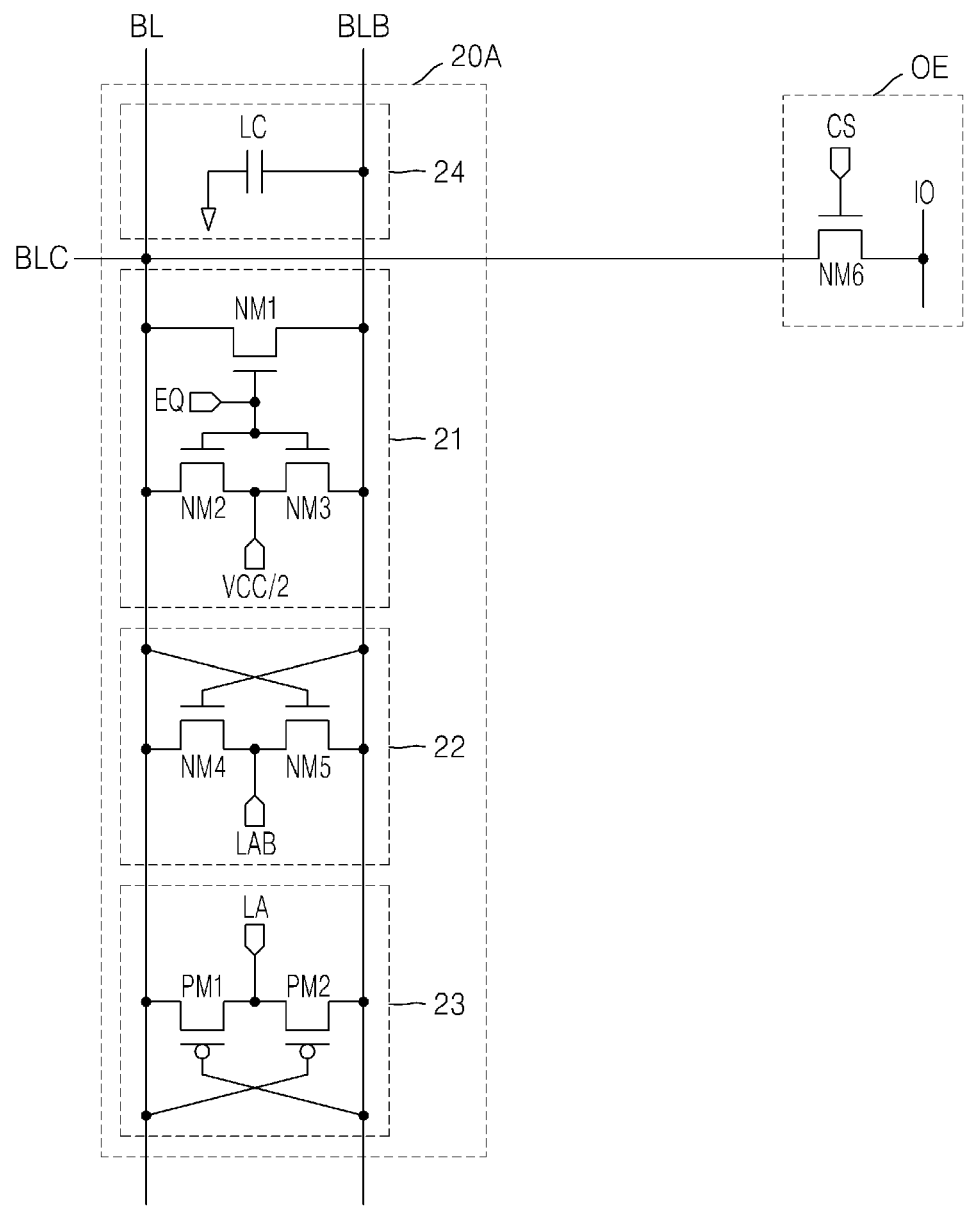
FIG. 2 is a schematic circuit diagram showing an example of a sense amplifier included in the semiconductor memory device of FIG. 1.

FIG. 2 is a schematic circuit diagram showing an example of a sense amplifier SA included in the semiconductor memory device of FIG. 1.

Referring to FIG. 2, a sense amplifier 20A may include an equalizing unit 21, a decompression unit 22, a boosting unit 23, and a loading capacitor 24. The sense amplifier 20A may be used in a semiconductor memory device including volatile memory cells.

Here, the equalizing unit 21, the decompression unit 22, and the boosting unit 23 may be connected to the bit line BL and the complementary bit line BLB. The loading capacitor 24 may be connected to the complementary bit line BLB. In the current embodiment, the sense amplifier 20A may be disposed above or below the cell bit line BLC, and thus sense amplifier 20A may be overlapped with the memory cell array 10 including the plurality of memory cells MC.

In the current embodiment, the cell bit line BLC may extend in a first direction, and the bit line BL and the complementary bit line BLB may extend parallel to each other in a second direction perpendicular to the first direction. Also, the equalizing unit 21, the decompression unit 22, the boosting unit 23, and the loading capacitor 24 that are included in the sense amplifier 20A may be disposed adjacent to one another in the second direction.

The equalizing unit 21 may equalize voltages of the bit line BL and the complementary bit line BLB based on an equalizing signal EQ and may include first to third NMOS transistors NM1 to NM3. The first NMOS transistor NM1 may include a source and a drain that are respectively connected to the bit line BL and the complementary bit line BLB, and a gate to which the equalizing signal EQ is applied. The second NMOS transistor NM2 may include a drain connected to the bit line BL, a source connected to a power supply voltage terminal having a predetermined level (for example, VCC/2), and a gate to which the equalizing signal EQ is applied. The third NMOS transistor NM3 is connected to the second NMOS transistor NM2 in series, and may include a drain connected to a power supply voltage terminal having a predetermined level (for example, VCC/2), a source connected to the complementary bit line BLB, and a gate to which the equalizing signal EQ is applied.

The decompression unit 22 may decompress a signal having a lower voltage level from among a signal of the bit line BL and a signal of the complementary bit line BLB. The decompression unit 22 may include fourth and fifth NMOS transistors NM4 and NM5. For example, the decompression unit 22 may decompress the signal having a lower voltage level from among the signals of the bit line BL and the complementary bit line BLB to 0 V. The fourth NMOS transistor NM4 may include a drain connected to the bit line BL, a source connected to a decompression signal LAB terminal, and a gate connected to the complementary bit line BLB. The fifth NMOS transistor NM5 may include a source connected to the decompression signal LAB terminal, a drain connected to the complementary bit line BLB, and a gate connected to the bit line BL.

The boosting unit 23 may boost a signal having a higher voltage level from among the signals of the bit line BL and the complementary bit line BLB, and may include first and second PMOS transistors PM1 and PM2. For example, the boosting unit 23 may boost the signal having a higher voltage level from among the signals of the bit line BL and the complementary bit line BLB to VCC. The first PMOS transistor PM1 may include a drain connected to the bit line BL, a source connected to a boosting signal LA terminal, and a gate connected to the complementary bit line BLB. The second PMOS transistor PM2 may include a source connected to the boosting signal LA terminal, a drain connected to the complementary bit line BLB, and a gate connected to the bit line BL.

The loading capacitor 24 may be connected to the complementary bit line BLB, and may be configured as a MOS capacitor in an embodiment of the present invention. For example, the loading capacitor 40 may be configured as a MOS capacitor formed in a P-well. As such, the sense amplifier 20A may include the loading capacitor 24 so that a voltage of the complementary bit line BLB may be restored to a reference voltage (for example, VCC/2) for operating the sense amplifier 20A.

The output element OE may be disposed at the side of the sense amplifier 20A. Here, the output unit 30 may transmit a signal of the bit line BL sensed by the sense amplifier 20A to an input/output line IO. In detail, the output element OE may include a column selection transistor NM6 having a drain connected to the bit line BL, a source connected to the input/output line IO, and a gate to which a column selection signal CS is applied.

Figure 3:
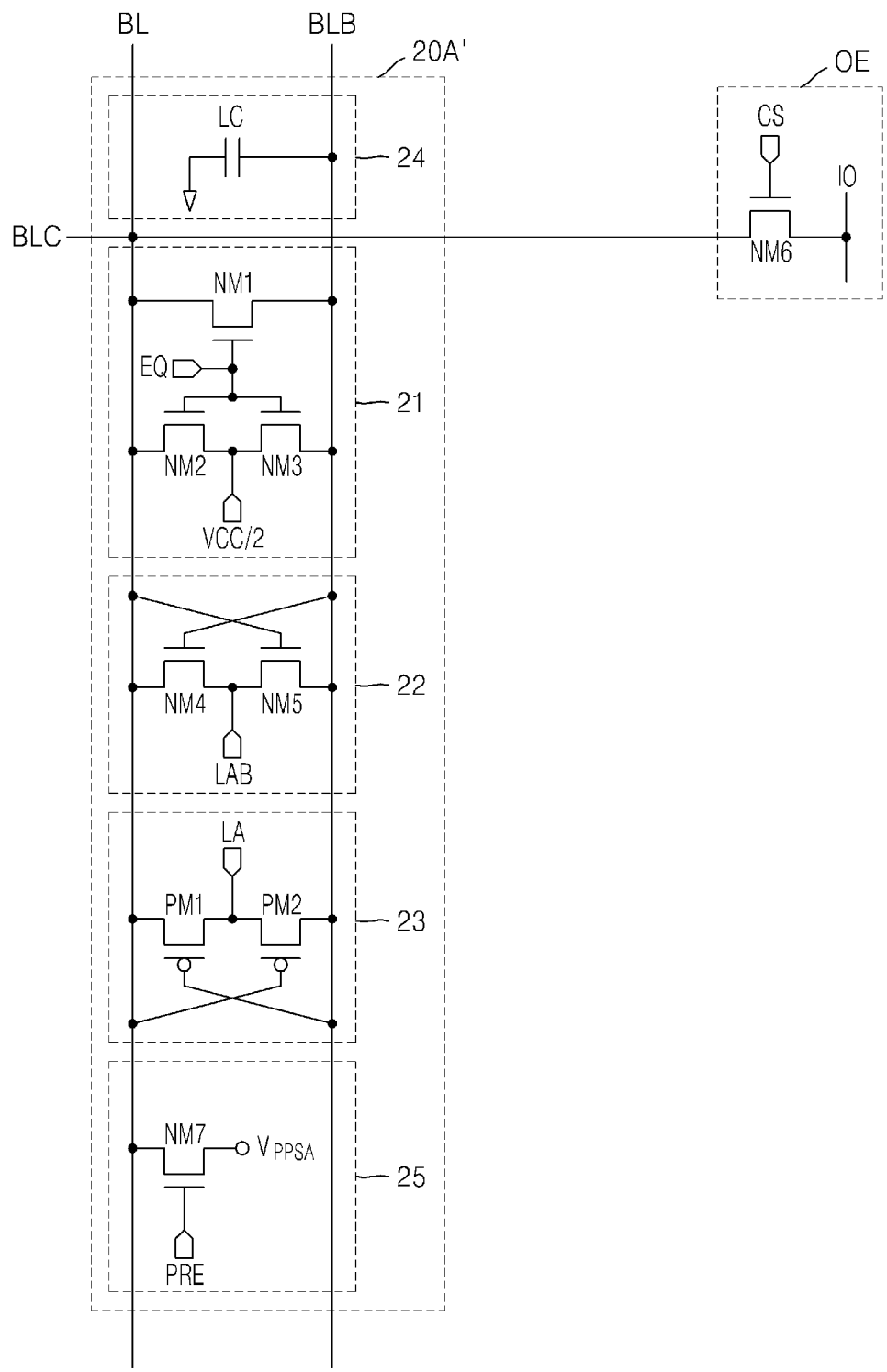
FIG. 3 is a schematic circuit diagram showing a modified example of the sense amplifier of FIG. 2.

FIG. 3 is a schematic circuit diagram showing a modified example of the sense amplifier 20A of FIG. 2.

Referring to FIG. 3, a sense amplifier 20A' may include the equalizing unit 21, the decompression unit 22, the boosting unit 23, the loading capacitor 24, and a precharging unit 25. Comparing the sense amplifier 20A' of FIG. 3 with the sense amplifier 20A of FIG. 2, the sense amplifier 20A' of the current embodiment may further include the precharging unit 25. Thus, the sense amplifier 20A' may be used in a semiconductor memory device including non-volatile memory cells.

The precharging unit 25 may precharge a voltage of the bit line BL to a precharge voltage. In detail, the precharging unit 25 may be implemented as a precharge transistor NM7 having a source connected to the bit line BL, a drain connected to a precharge voltage terminal VPPSA, and a gate to which a precharge enable signal PRE is applied. If the precharge enable signal PRE is activated, the precharge transistor NM7 is turned on, and thus the bit line BL may be precharged to the precharge voltage.

Figure 4:
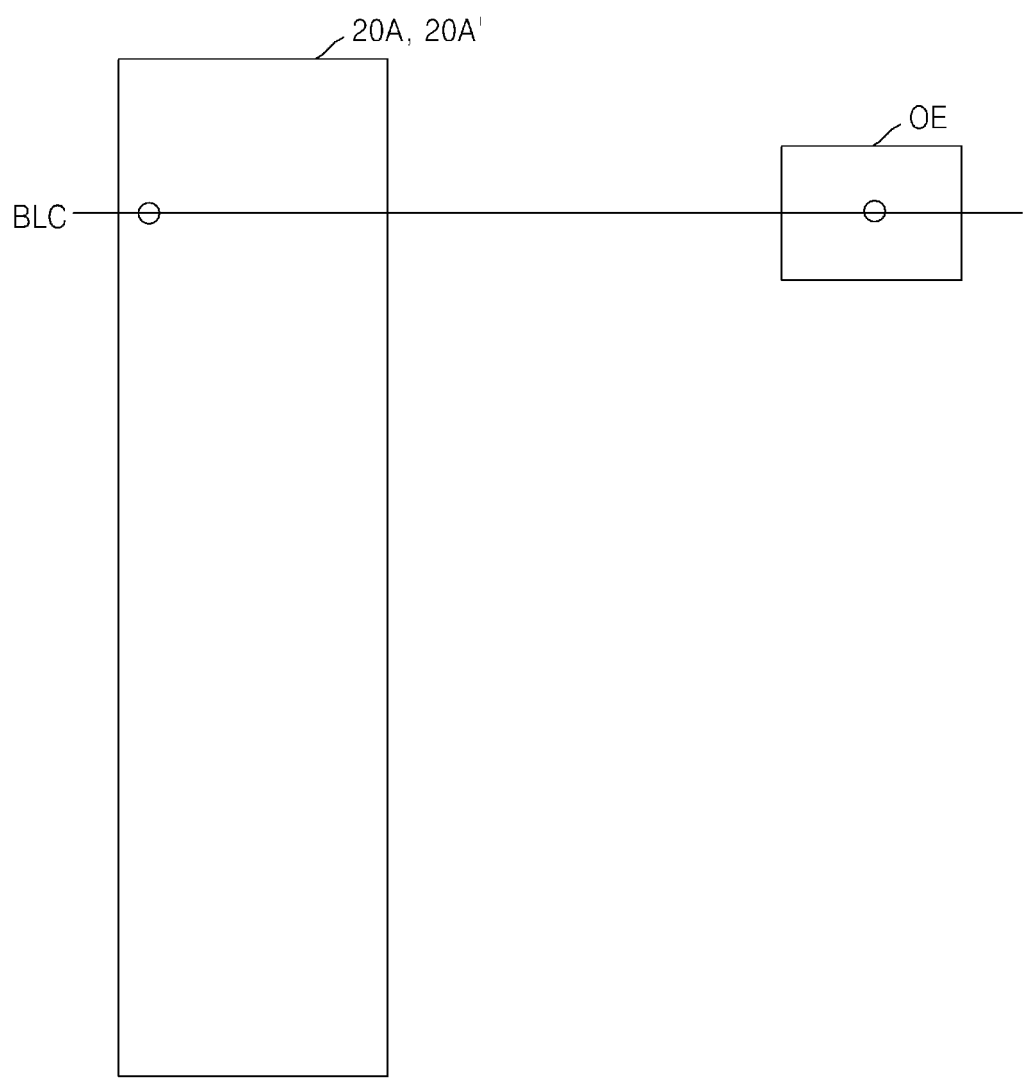
FIG. 4 is a schematic block diagram of each of the sense amplifiers of FIGS. 2 and 3.

FIG. 4 is a schematic block diagram of each of the sense amplifiers 20A and 20A' of FIGS. 2 and 3.

Referring to FIG. 4, connections between each of the sense amplifiers 20A and 20A' and the cell bit line BLC, and between the output element OE and the cell bit line BLC are simply shown as 'O'. Also, for convenience of description, the bit line BL and the complementary bit line BLB are not shown in the drawing. Furthermore, for convenience of description, the input/output line 10 is not shown in the drawing.

Figure 5:
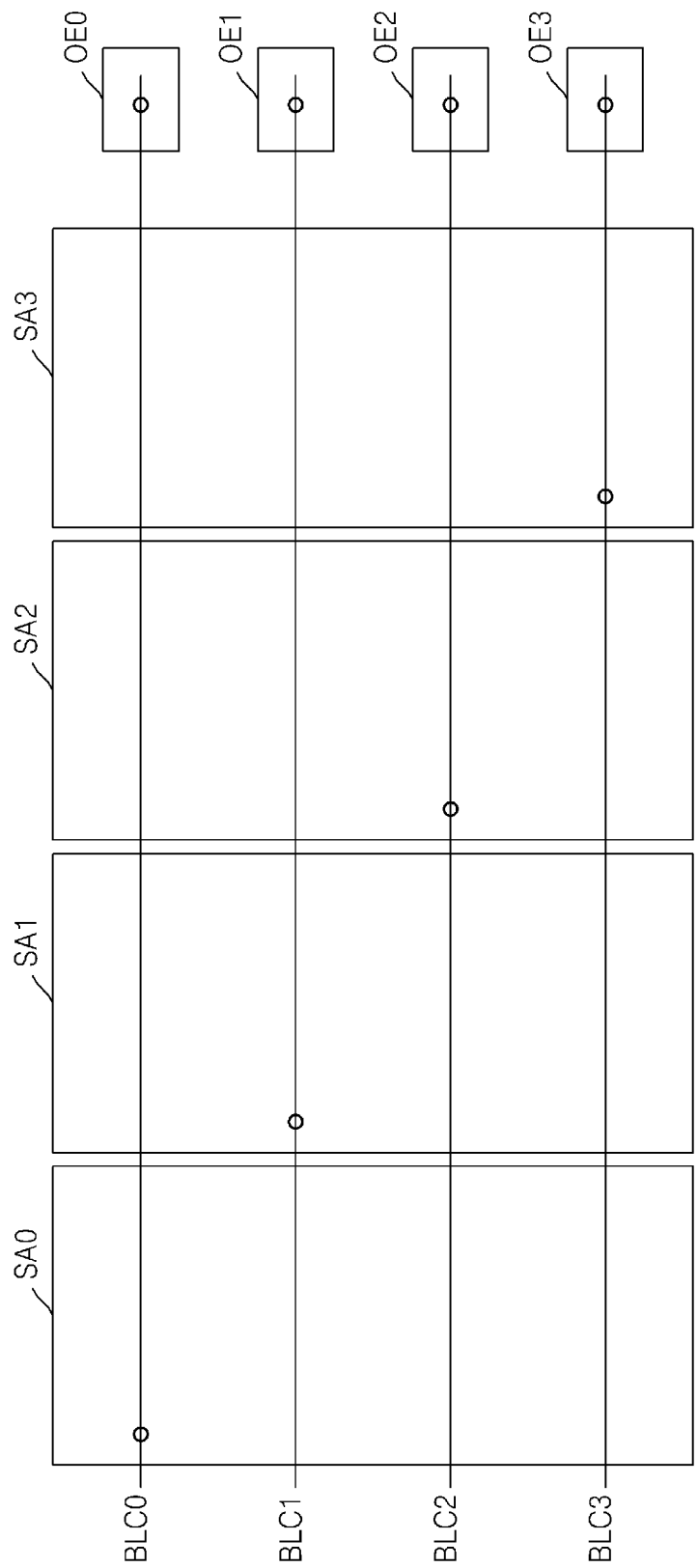
FIG. 5 is a schematic diagram showing an example of arrangement of a plurality of cell bit lines and a plurality of sense amplifiers in a semiconductor memory device including the sense amplifier of FIG. 4.

FIG. 5 is a schematic diagram showing an example of arrangement of a plurality of cell bit lines and a plurality of sense amplifiers in the semiconductor memory device including the sense amplifiers 20A or 20A' of FIG. 4.

Referring to FIG. 5, first to fourth sense amplifiers SA0 to SA3 may be disposed above or below first to fourth cell bit lines BLC0 to BLC3. In detail, the first sense amplifier SA0 may be connected to the first cell bit line BLC0, the second sense amplifier SA1 may be connected to the second cell bit line BLC1, the third sense amplifier SA2 may be connected to the third cell bit line BLC2, and the fourth sense amplifier SA3 may be connected to the fourth cell bit line BLC3.

First to fourth output elements OE0, OE1, OE2, and OE3 may be respectively connected to the first to fourth cell bit lines BLC0 to BLC3. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3.

Figure 6:
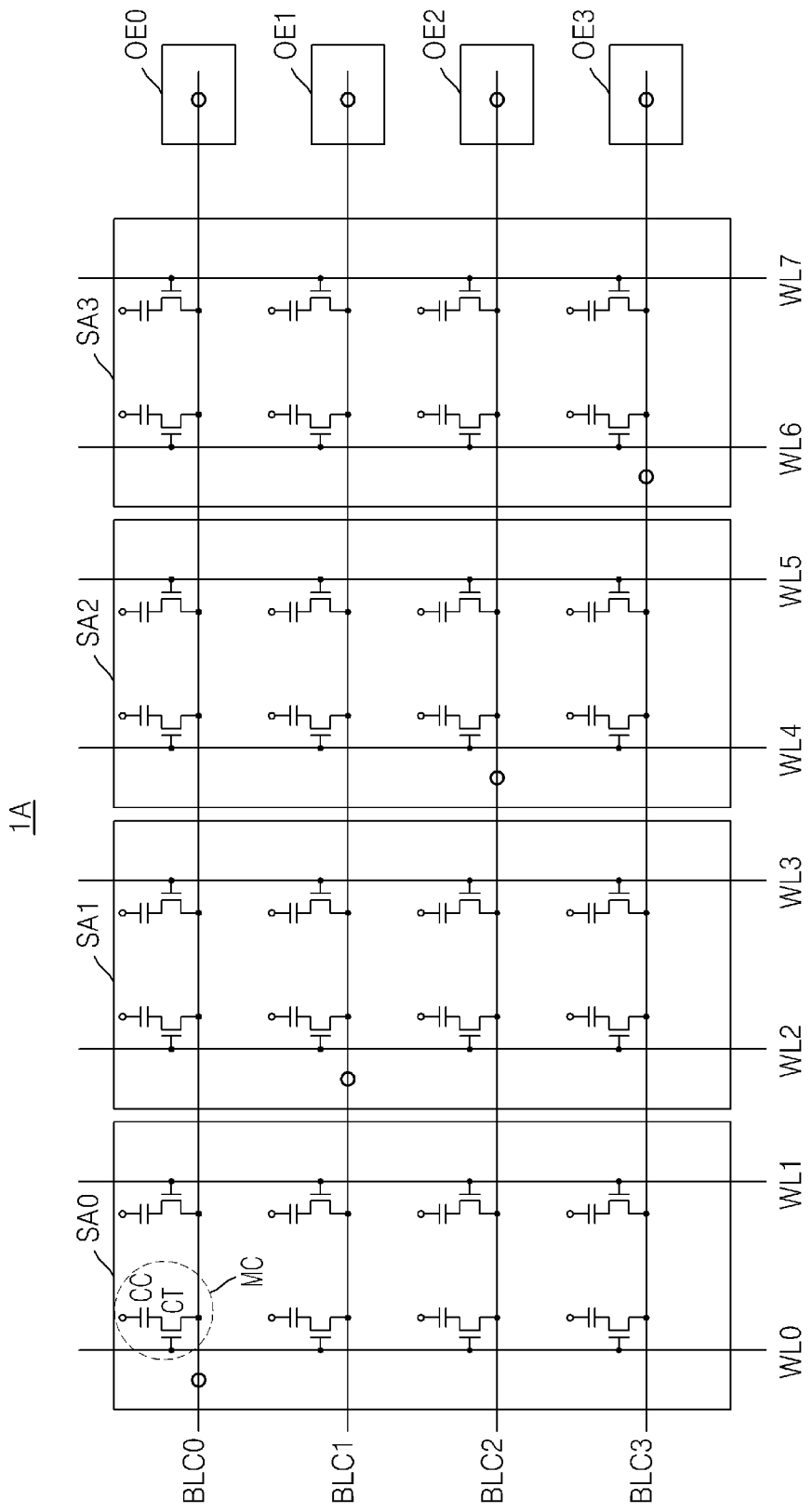
FIG. 6 is a diagram showing a semiconductor memory device having a structure shown in FIG. 5.

FIG. 6 is a diagram showing a semiconductor memory device 1A having a structure shown in FIG. 5.

Referring to FIG. 6, the semiconductor memory device 1A may include a plurality of memory cells MC that are respectively disposed in regions where first to fourth cell bit lines BLC0 to BLC3 and a plurality of word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC together may constitute the memory cell array 10 of FIG. 1. Here, the plurality of memory cells MC may be DRAM cells each including a cell transistor CT and a cell capacitor CC.

Figure 7:
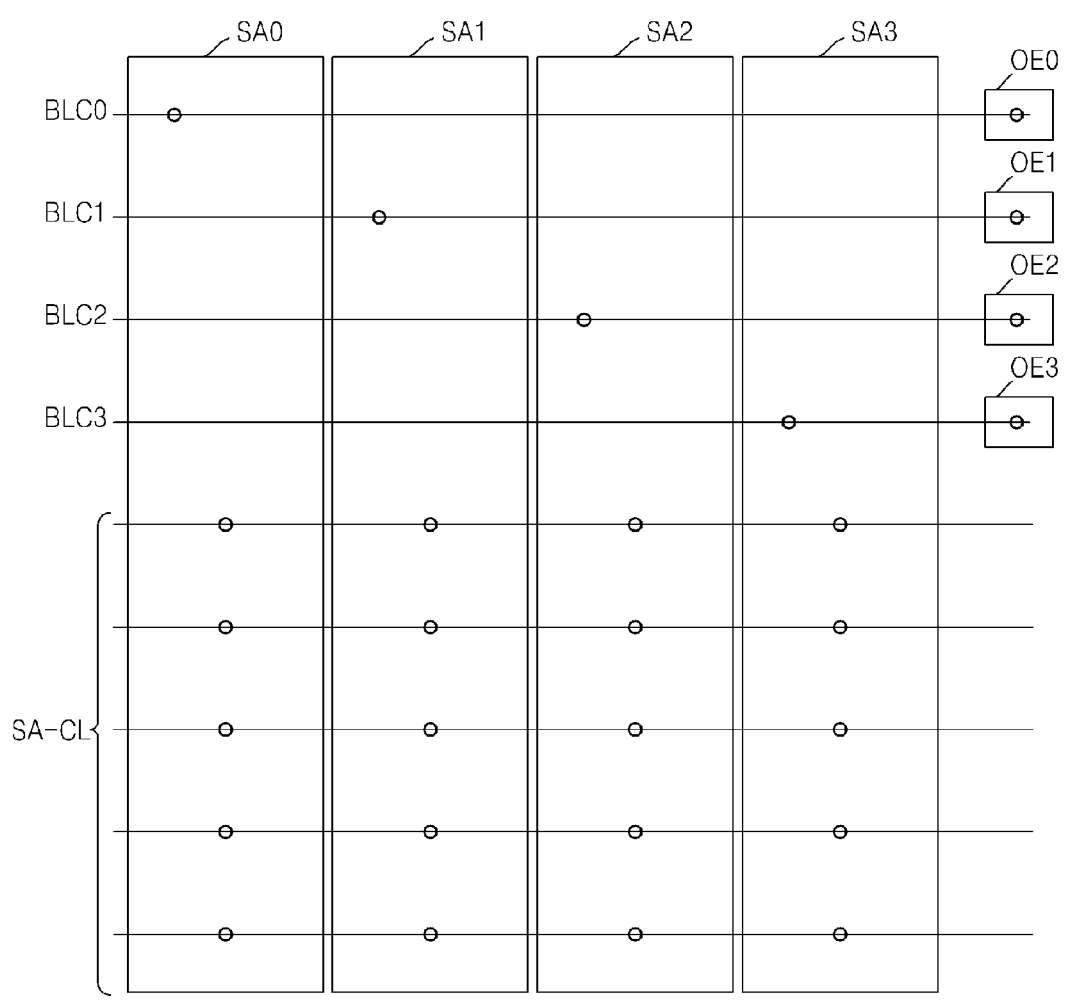
FIG. 7 is a schematic diagram showing another example of arrangement of the plurality of cell bit lines, the plurality of sense amplifier control lines, and the plurality of sense amplifiers in the semiconductor memory device including the sense amplifier of FIG. 4.

FIG. 7 is a schematic diagram showing another example of arrangement of a plurality of cell bit lines, a plurality of sense amplifier control lines, and a plurality of sense amplifiers in the semiconductor memory device including the sense amplifiers 20A or 20A' of FIG. 4.

Referring to FIG. 7, the first to fourth sense amplifiers SA0 to SA3 may be disposed above or below the first to fourth cell bit lines BLC0 to BLC3 and the plurality of sense amplifier control lines SA_CL. Here, the plurality of sense amplifier control lines SA_CL may each provide the equalizing signal EQ, the decompression signal LAB, the boosting signal LA, and the power supply voltage (for example, VCC/2) that are shown in FIGS. 2 and 3. Furthermore, the sense amplifier control lines SA_CL may each provide a P-well voltage and an N-well voltage. However, the number of sense amplifier control lines SA_CL is just an example, and may vary in various ways.

According to the current embodiment, since some of the cell bit lines may be used as sense amplifier control lines SA_CL without including additional wires for providing a plurality of control signals required to drive the sense amplifier SA, a wiring process may be simplified.

In detail, the first sense amplifier SA0 may be connected to the first cell bit line BLC0 and the sense amplifier control lines SA_CL, the second sense amplifier SA1 may be connected to the second cell bit line BLC1 and the sense amplifier control lines SA_CL, the third sense amplifier SA2 may be connected to the third cell bit line BLC2 and the sense amplifier control lines SA_CL, and the fourth sense amplifier SA3 may be connected to the fourth cell bit line BLC3 and the sense amplifier control lines SA_CL.

First to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3.

Figure 8:
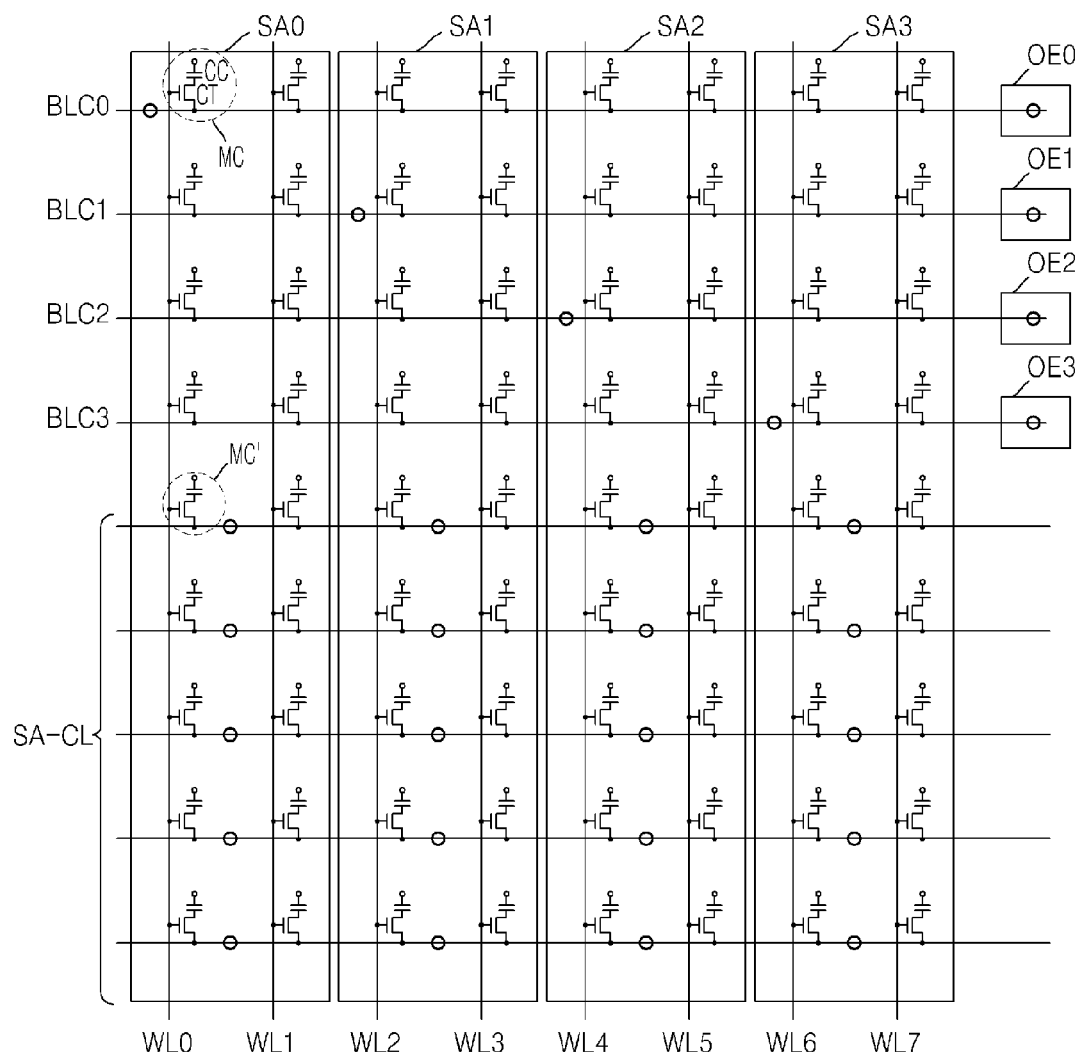
FIG. 8 is a diagram showing a semiconductor memory device having a structure shown in FIG. 7.

FIG. 8 is a diagram showing a semiconductor memory device 1B having a structure shown in FIG. 7.

Referring to FIG. 8, the semiconductor memory device 1B may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be DRAM cells each including a cell transistor CT and a cell capacitor CC.

Also, the semiconductor memory device 1B may include a plurality of additional memory cells MC' that are respectively disposed in regions where the sense amplifier control lines SA_CL and the word lines WL0, WL1, WL2, WL3, WL4, WL5, WL6, WL7 cross each other. Accordingly, the memory cell array 10 may further include the additional memory cells MC'. Here, the additional memory cells MC' may be DRAM cells each including the cell transistor CT and the cell capacitor CC.

Figure 9:
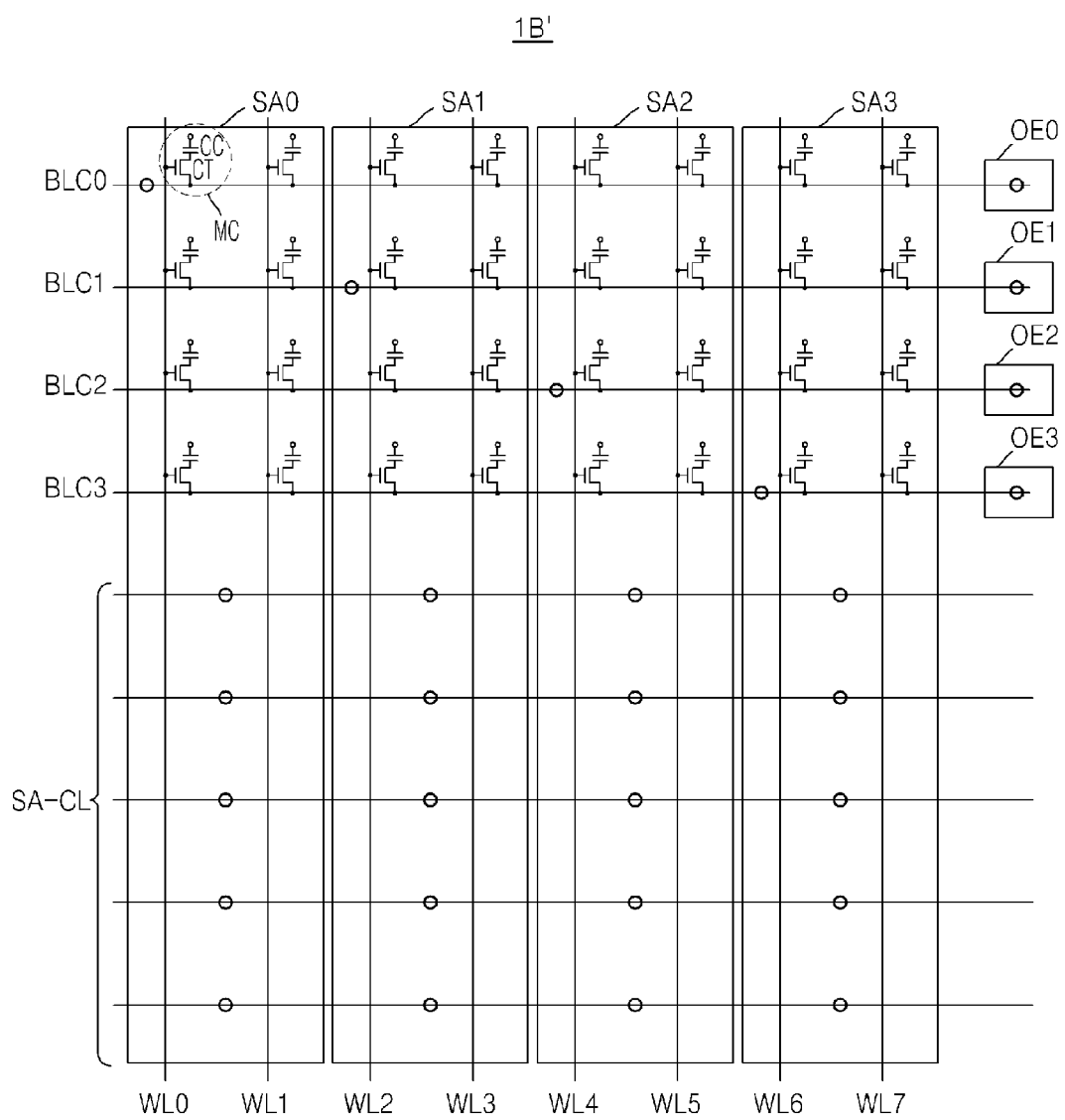
FIG. 9 is a diagram showing a modified example of the semiconductor memory device of FIG. 8.

FIG. 9 is a diagram showing a modified example of the semiconductor memory device 1B of FIG. 8.

Referring to FIG. 9, the semiconductor memory device 1B' may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be DRAM cells each including a cell transistor CT and a cell capacitor CC.

According to the current embodiment, the semiconductor memory device 1B' may not include additional memory cells MC' that are respectively disposed in regions where the sense amplifier control lines SA_CL and the word lines WL0, WL1, WL2, WL3, WL4, WL5, WL6, and WL7 cross each other. In detail, the semiconductor memory device 1B' may remove at least one from among components constituting cells except for the first to fourth cell bit lines BLC0 to BLC3 and the word lines WL0, WL1, WL2, WL3, WL4, WL5, WL6, and WL7. For example, the semiconductor memory device 1B' may remove the cell capacitor CC that is disposed in each of the regions where the sense amplifier control lines SA_CL and the word lines WL0, WL1, WL2, WL3, WL4, WL5, WL6, and WL7 cross each other, or may electrically separate a channel region from the cell transistor CT, thereby reducing an electrical fatigue of the semiconductor memory device 1B' and preventing malfunction of the sense amplifiers SA0 to SA3.

Figure 10:
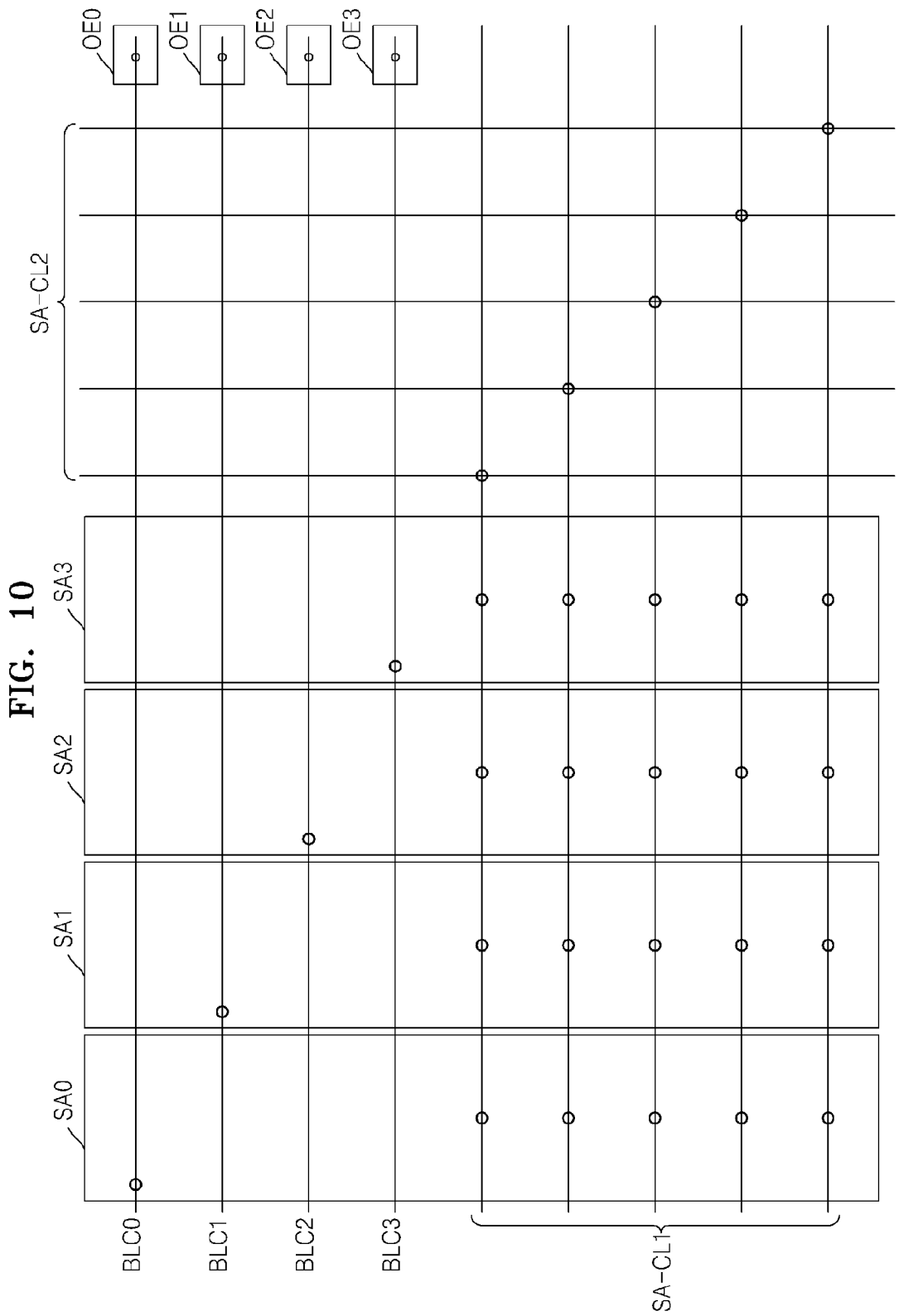
FIG. 10 is a schematic diagram showing another example of arrangement of the plurality of cell bit lines, a plurality of first sense amplifier control lines, a plurality of second sense amplifier control lines, and the plurality of sense amplifiers in the semiconductor memory device including the sense amplifier of FIG. 4.

FIG. 10 is a schematic diagram showing another example of arrangement of a plurality of cell bit lines, a plurality of first sense amplifier control lines, a plurality of second sense amplifier control lines, and a plurality of sense amplifiers in the semiconductor memory device including the sense amplifiers 20A or 20A' of FIG. 4.

Referring to FIG. 10, the first to fourth sense amplifiers SA0 to SA3 may be disposed above or below the first to fourth cell bit lines BLC0 to BLC3 and the plurality of first sense amplifier control lines SA_CL1. Here, the first sense amplifier control lines SA_CL1 may each provide the equalizing signal EQ, the decompression signal LAB, the boosting signal LA, and the power supply voltage (for example, VCC/2) that are shown in FIGS. 2 and 3. Furthermore, the first sense amplifier control lines SA_CL1 may each provide a P-well voltage and an N-well voltage. However, the number of first sense amplifier control lines SA_CL1 is just an example, and may vary in various ways.

In detail, the first sense amplifier SA0 may be connected to the first cell bit line BLC0 and the first sense amplifier control lines SA_CL1, the second sense amplifier SA1 may be connected to the second cell bit line BLC1 and the first sense amplifier control lines SA_CL1, the third sense amplifier SA2 may be connected to the third cell bit line BLC2 and the first sense amplifier control lines SA_CL1, and the fourth sense amplifier SA3 may be connected to the fourth cell bit line BLC3 and the first sense amplifier control lines SA_CL1.

A plurality of second sense amplifier control lines SA_CL2 may be disposed parallel to a plurality of word lines WL0, WL1, WL2, WL3, WL4, WL5, WL6, and WL7. Also, the second sense amplifier control lines SA_CL2 may be connected to the first sense amplifier control lines SA_CL1, respectively.

The first to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3.

Figure 11:
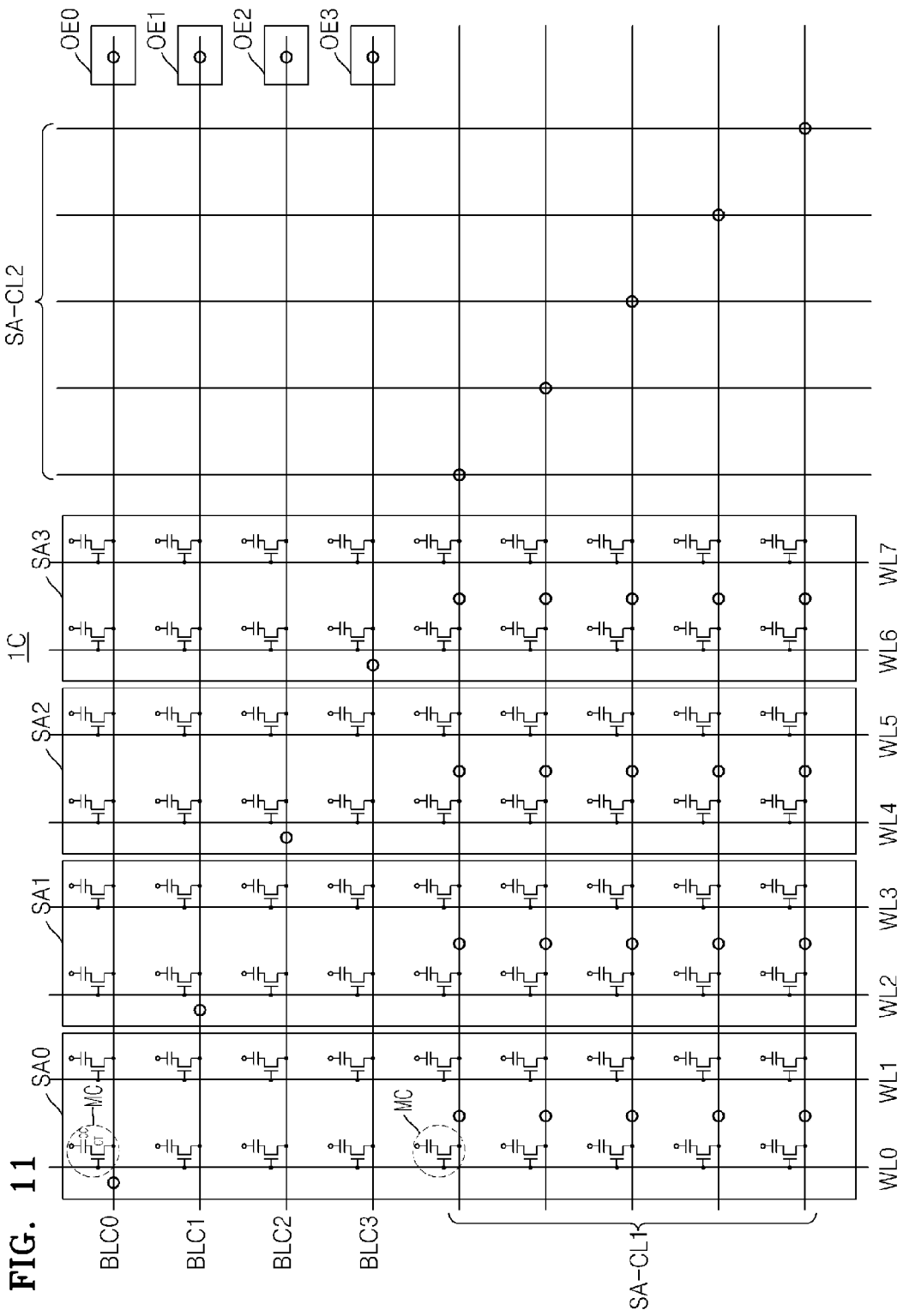
FIG. 11 is a diagram showing a semiconductor memory device having a structure shown in FIG. 10.

FIG. 11 is a diagram showing a semiconductor memory device 1C having a structure shown in FIG. 10.

Referring to FIG. 11, the semiconductor memory device 1C may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be DRAM cells each including a cell transistor CT and a cell capacitor CC.

Also, the semiconductor memory device 1C may include additional memory cells MC' that are respectively disposed in regions where the first sense amplifier control lines SA_CL1 and the word lines WL0, WL1, WL2, WL3, WL4, WL5, WL6, and WL7 cross each other. Thus, the memory cell array 10 may further include the additional memory cells MC'. Here, the additional memory cells MC' may be DRAM cells each including a cell transistor CT and a cell capacitor CC.

Figure 12:
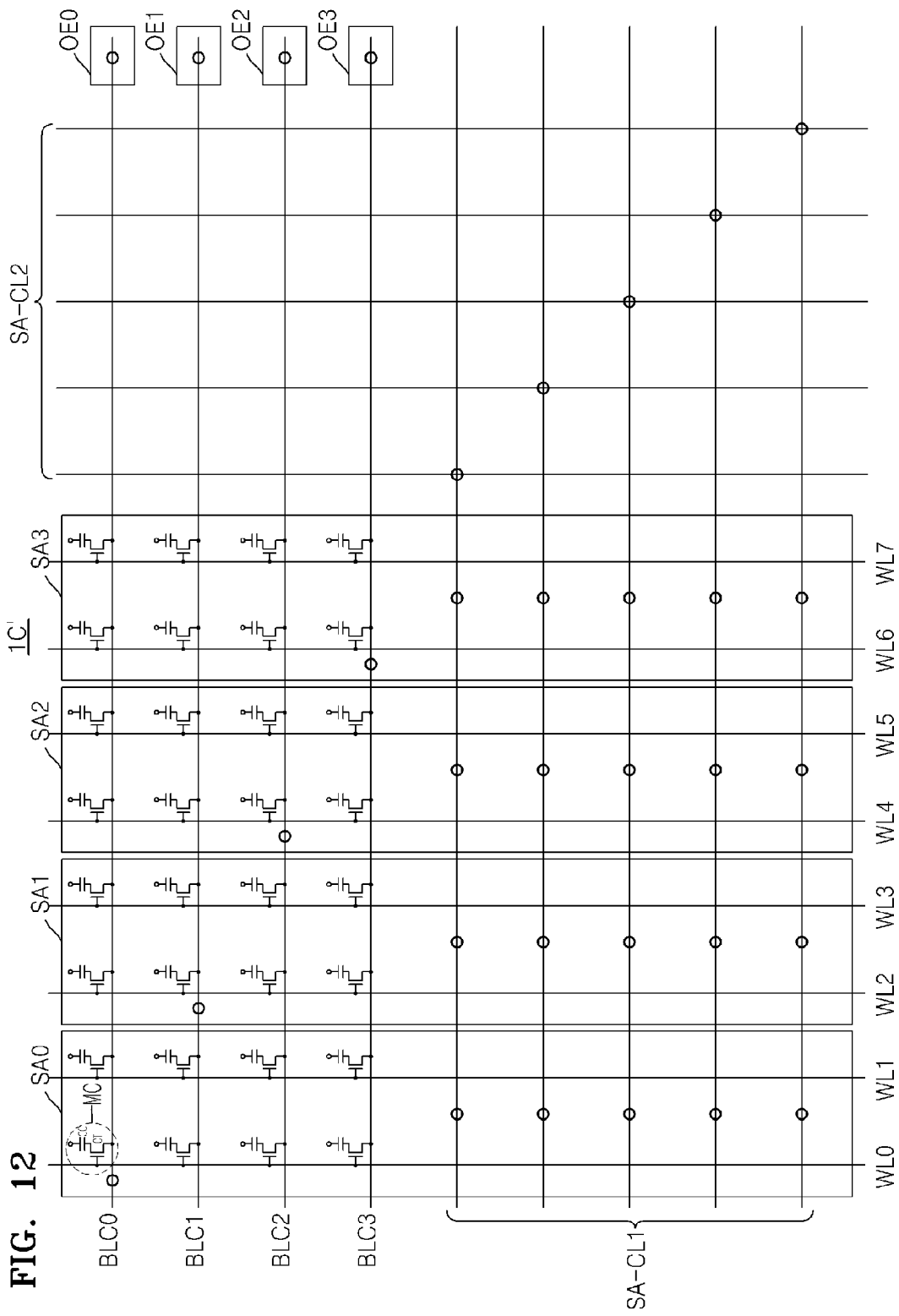
FIG. 12 is a diagram showing a modified example of the semiconductor memory device of FIG. 11.

FIG. 12 is a diagram showing a modified example of the semiconductor memory device 1C of FIG. 11.

Referring to FIG. 12, the semiconductor memory device 1C' may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be DRAM cells each including a cell transistor CT and a cell capacitor CC.

According to the current embodiment, the semiconductor memory device 1C' may not include additional memory cells MC' that are respectively disposed in regions where the sense amplifier control lines SA-CL1 and the word lines WL0, WL1, WL2, WL3, WL4, WL5, WL6, and WL7 cross each other. In detail, the semiconductor memory device 1C' may remove at least one from among components constituting cells except for the first to fourth cell bit lines BLC0 to BLC3 and the word lines WL0, WL1, WL2, WL3, WL4, WL5, WL6, and WL7. For example, the semiconductor memory device 1C' may remove the cell capacitor CC that is disposed in each of the regions where sense amplifier control lines SA-CL1 and the word lines WL0, WL1, WL2, WL3, WL4, WL5, WL6, and WL7 cross each other, or may electrically separate a channel region from the cell transistor CT, thereby reducing an electrical fatigue of the semiconductor memory device 1C' and preventing malfunction of the sense amplifiers SA0 to SA3.

Figure 13:
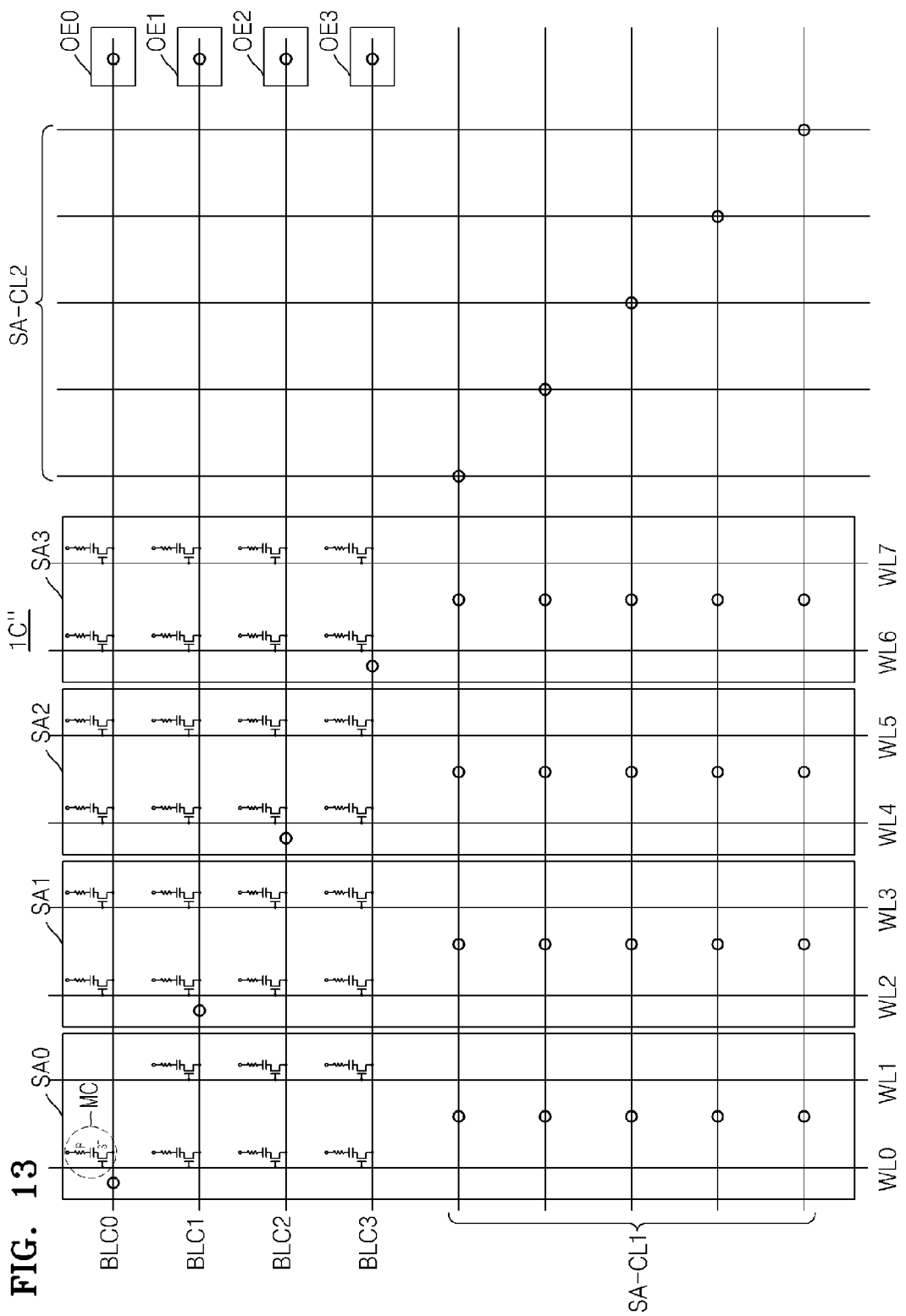
FIG. 13 is a diagram showing another modified example of the semiconductor memory device of FIG. 11.

FIG. 13 is a diagram showing another modified example of the semiconductor memory device 1C of FIG. 11.

Referring to FIG. 13, the semiconductor memory device 1C" may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be resistive memory cells such as a PRAM or an RRAM including a variable resistor R and a selection transistor ST.

Here, the semiconductor memory device 1C" may not include additional memory cells MC' that are respectively disposed in regions where the sense amplifier control lines SA-CL1 and the word lines WL0, WL1, WL2, WL3, WL4, WL5, WL6, and WL7 cross each other. In detail, the semiconductor memory device 1C" may remove at least one from among components constituting cells except for the first to fourth cell bit lines BLC0 to BLC3 and the word lines WL0, WL1, WL2, WL3, WL4, WL5, WL6, and WL7. For example, the semiconductor memory device 1C" may remove the variable resistor R that is disposed in each of the regions where the sense amplifier control lines SA-CL1 and the word lines WL0, WL1, WL2, WL3, WL4, WL5, WL6, and WL7 cross each other, or may electrically separate a channel region from the selection transistor ST, thereby reducing an electrical fatigue of the semiconductor memory device 1C" and preventing malfunction of the sense amplifiers SA0 to SA3.

Figure 14:
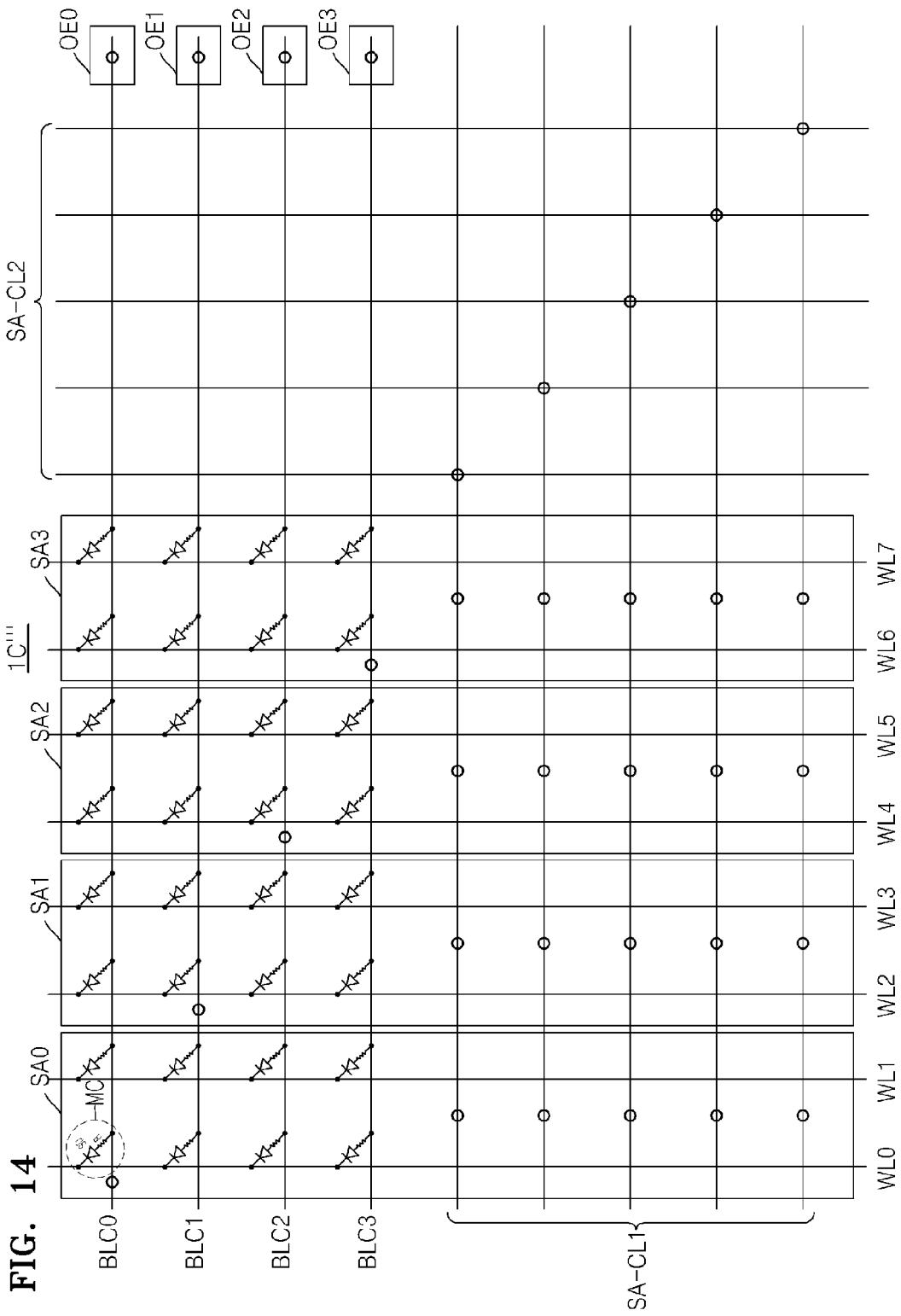
FIG. 14 is a diagram showing another modified example of the semiconductor memory device of FIG. 11.

FIG. 14 is a diagram showing another modified example of the semiconductor memory device 1C of FIG. 11.

Referring to FIG. 14, a semiconductor memory device 1C''' may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC may be resistive memory cells such as a PRAM or an RRAM including a variable resistor R and a selection diode SD.

Also, the semiconductor memory device 1C''' may not include additional memory cells MC' that are respectively disposed in regions where the sense amplifier control lines SA-CL1 and the word lines WL0, WL1, WL2, WL3, WL4, WL5, WL6, and WL7 cross each other. In detail, the semiconductor memory device 1C''' may remove at least one from among components constituting cells except for the first to fourth cell bit lines BLC0 to BLC3 and the word lines WL0, WL1, WL2, WL3, WL4, WL5, WL6, and WL7. For example, the semiconductor memory device 1C''' may remove the variable resistance R that is disposed in each of the regions where the sense amplifier control lines SA-CL1 and the word lines WL0, WL1, WL2, WL3, WL4, WL5, WL6, and WL7 cross each other, or may electrically separate a channel region from the selection diode SD, thereby reducing an electrical fatigue of the semiconductor memory device 1C''' and preventing malfunction of the sense amplifiers SA0 to SA3.

Figure 15:
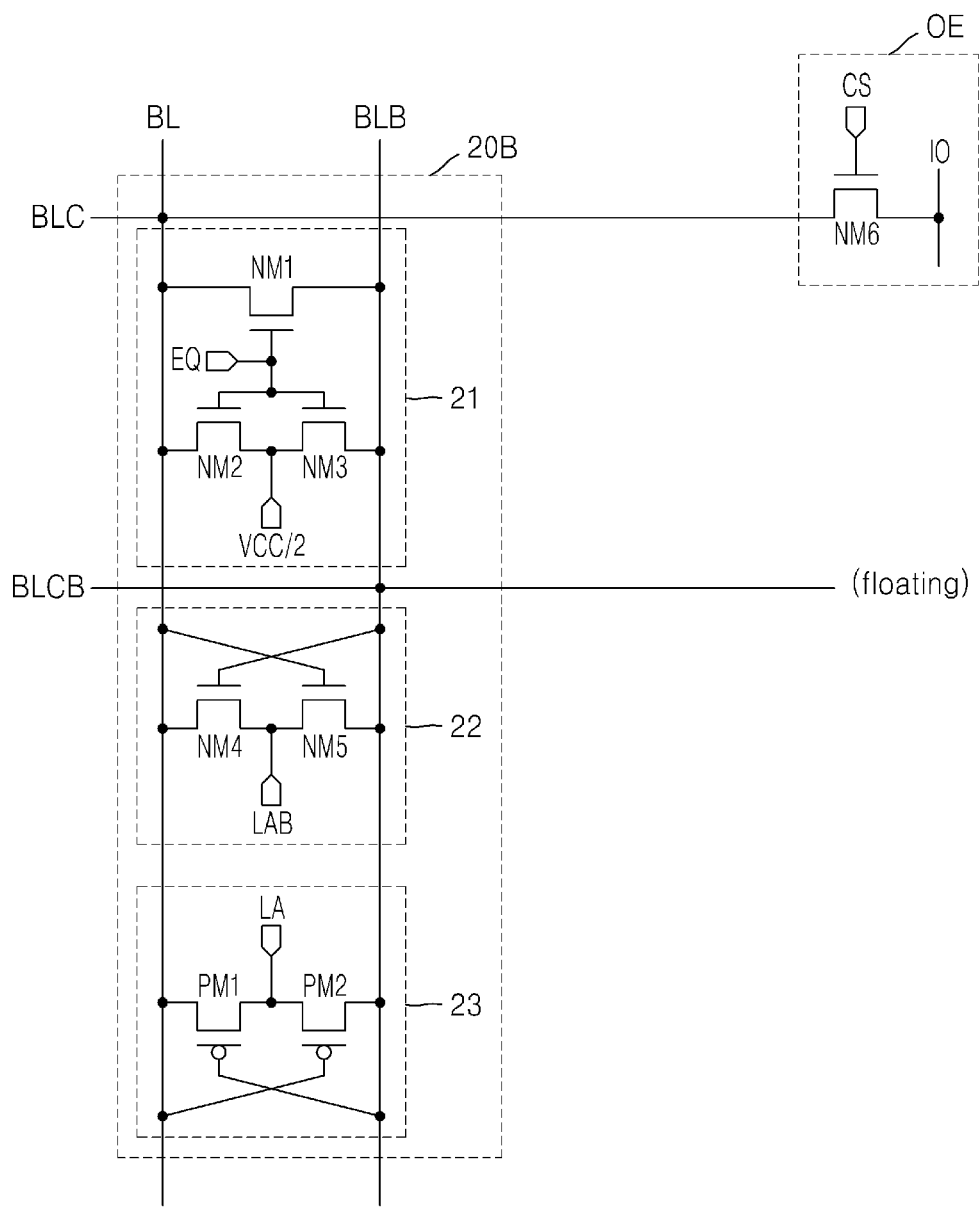
FIG. 15 is a schematic circuit diagram showing another example of the sense amplifier included in the semiconductor memory device of FIG. 1.

FIG. 15 is a schematic circuit diagram showing another example of the sense amplifier SA included in the semiconductor memory device of FIG. 1.

Referring to FIG. 15, a sense amplifier 20B may include an equalizing unit 21, a decompression unit 22, and a boosting unit 23. The sense amplifier 20B may be used in a semiconductor memory device including volatile memory cells.

Here, the equalizing unit 21, the decompression unit 22, and the boosting unit 23 may be connected to a bit line BL and a complementary bit line BLB. Here, the equalizing unit 21, the decompression unit 22, and the boosting unit 23 may be substantially configured in a similar fashion as those shown in FIG. 2, and thus a detailed description thereof will be omitted.

According to the current embodiment, the sense amplifier 20B may not further include a loading capacitor by floating one end of a complementary cell bit line BLCB. In the current embodiment, the sense amplifier 20B may be disposed above or below the cell bit line BLC and the complementary cell bit line BLCB, and thus the sense amplifier 20B may be overlapped with the memory cell array 10 of FIG. 1 including the memory cells MC in a planar fashion. Here, the complementary cell bit line BLCB may be connected to the complementary bit line BLB, and the cell bit line BLC may be connected to the bit line BL.

In the current embodiment, the cell bit line BLC and the complementary cell bit line BLCB may extend parallel to each other in a first direction, and the bit line BL and the complementary bit line BLB may extend parallel to each other in a second direction perpendicular to the first direction. Also, the equalizing unit 21, the decompression unit 22, and the boosting unit 23 included in the sense amplifier 20B may be disposed adjacent to one another in the second direction.

Figure 16:
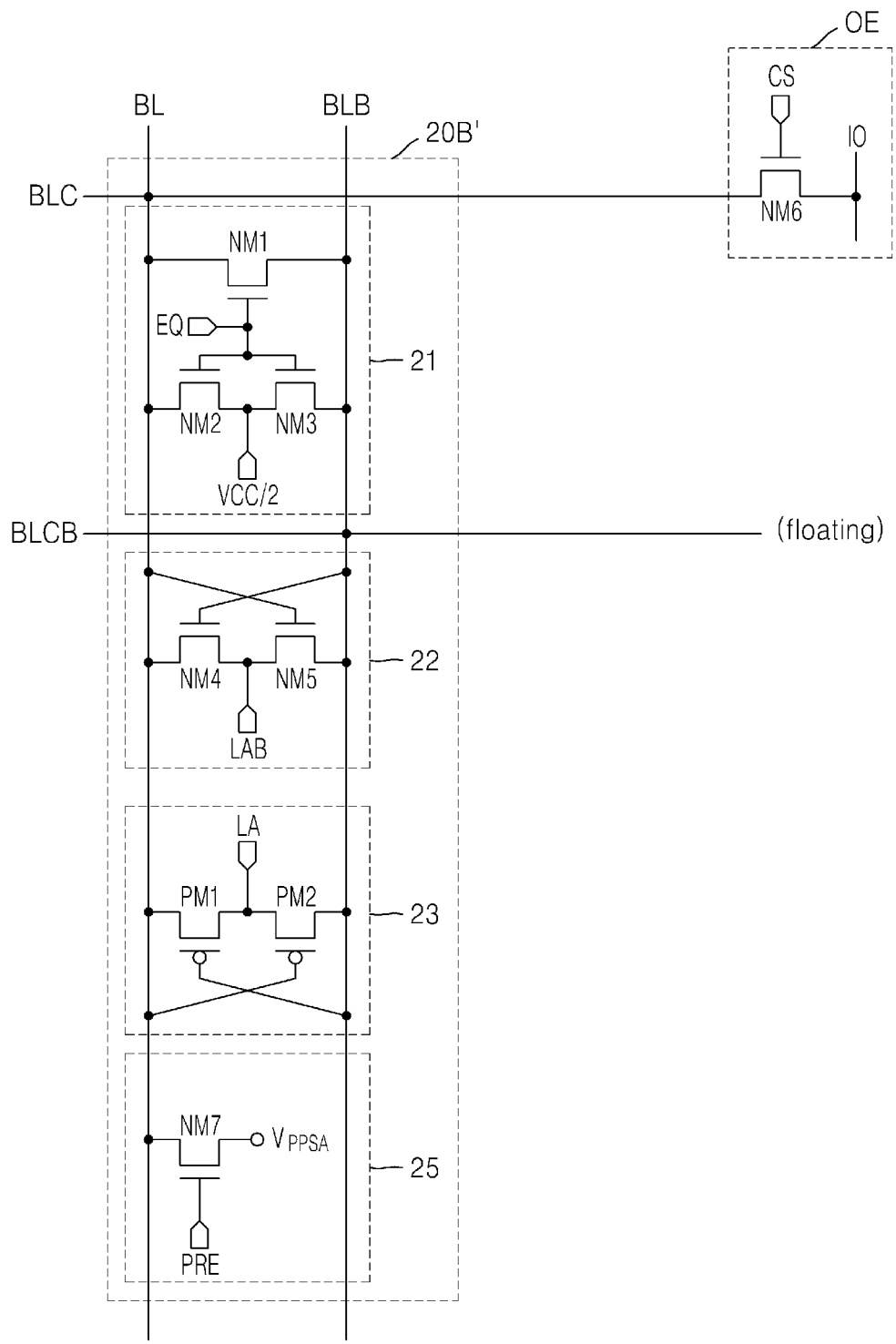
FIG. 16 is a schematic circuit diagram showing a modified example of the sense amplifier of FIG. 15.

FIG. 16 is a schematic circuit diagram showing a modified example of the sense amplifier of FIG. 15.

Referring to FIG. 16, a sense amplifier 20B' may include a equalizing unit 21, a decompression unit 22, a boosting unit 23, and a precharging unit 25. Comparing the sense amplifier 20B' of FIG. 16 with the sense amplifier 20B of FIG. 15, the sense amplifier 20B' may further include the precharging unit 25. Thus, the sense amplifier 20B' may be used in a semiconductor memory device including non-volatile memory cells. Here, the equalizing unit 21, the decompression unit 22, the boosting unit 23, and the precharging unit 25 may be substantially configured in a similar way to those of FIGS. 2, 3, and 15, and thus a detailed description thereof will be omitted.

Figure 17:
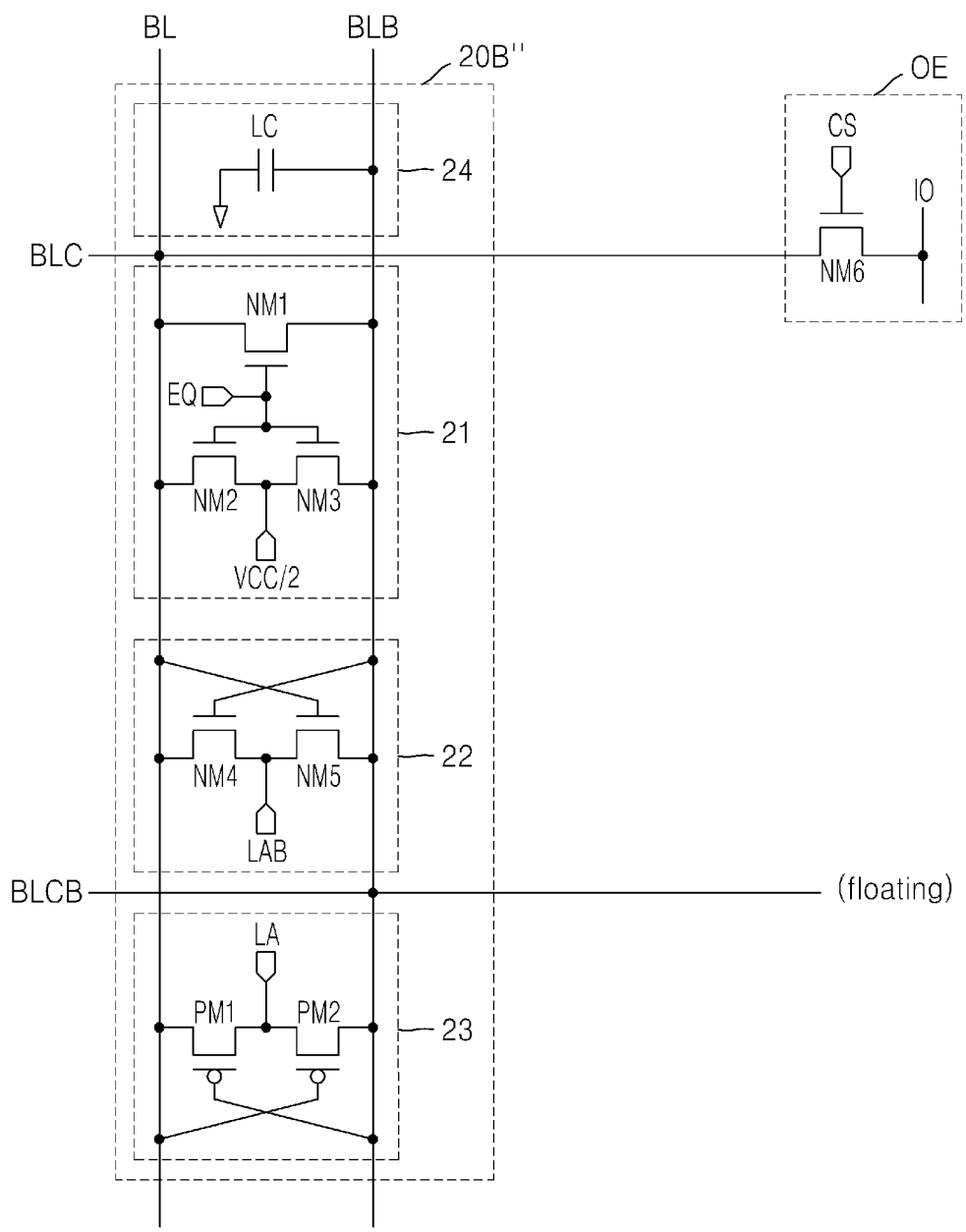
FIG. 17 is a schematic circuit diagram showing another modified example of the sense amplifier included in the semiconductor memory device of FIG. 1.

FIG. 17 is a schematic circuit diagram showing another modified example of the sense amplifier SA included in the semiconductor memory device of FIG. 1.

Referring to FIG. 17, a sense amplifier 20B" may include a equalizing unit 21, a decompression unit 22, a boosting unit 23, and a loading capacitor 24. The sense amplifier 20B" may be used in a semiconductor memory device including volatile memory cells.

Here, the equalizing unit 21, the decompression unit 22, and the boosting unit 23 may be connected to the bit line BL and the complementary bit line BLB. The loading capacitor 24 may be connected to the complementary bit line BLB. Here, the equalizing unit 21, the decompression unit 22, the boosting unit 23, and the loading capacitor 24 may be substantially configured in a similar way to those of FIG. 2, and thus a detailed description thereof will be omitted.

According to the current embodiment, one end of the complementary cell bit line BLCB may be floated, and the sense amplifier 20B" may include the loading capacitor 24. In the current embodiment, the sense amplifier 20B" may be disposed above or below the cell bit line BLC and the complementary cell bit line BLCB, and thus the sense amplifier 20B" may be overlapped with the memory cell array 10 of FIG. 1 including the memory cells MC in a planar fashion. Here, the complementary cell bit line BLCB may be connected to the complementary bit line BLB, and the cell bit line BLC may be connected to the bit line BL.

In the current embodiment, the cell bit line BLC and the complementary cell bit line BLCB may extend parallel to each other in a first direction, and the bit line BL and the complementary bit line BLB may extend parallel to each other in a second direction perpendicular to the first direction. Also, the equalizing unit 21, the decompression unit 22, the boosting unit 23, and the loading capacitor 24 included in the sense amplifier 20B" may be disposed adjacent to one another in the second direction.

Figure 18:
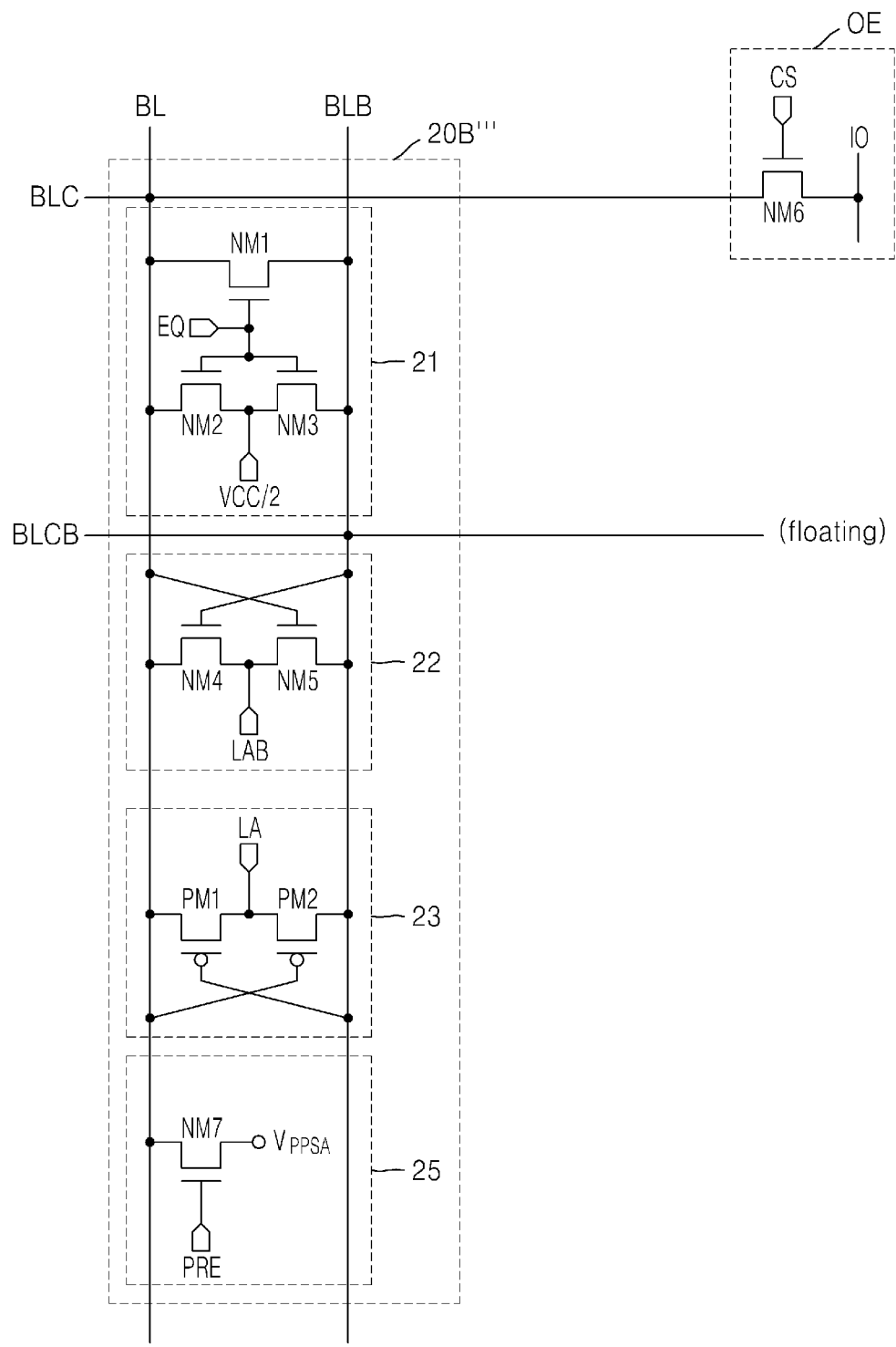
FIG. 18 is a schematic circuit diagram showing a modified example of the sense amplifier of FIG. 17.

FIG. 18 is a schematic circuit diagram showing a modified example of the sense amplifier 20B" of FIG. 17.

Referring to FIG. 18, a sense amplifier 20B''' may include a equalizing unit 21, a decompression unit 22, a boosting unit 23, a loading capacitor 24, and a precharging unit 25. Comparing the sense amplifier 20B''' of FIG. 18 with the sense amplifier 20B" of FIG. 17, the sense amplifier 20B''' may further include the precharging unit 25. Thus, the sense amplifier 20B''' may be used in a semiconductor memory device including non-volatile memory cells. Here, the equalizing unit 21, the decompression unit 22, the boosting unit 23, the loading capacitor 24, and the precharging unit 25 may be substantially configured in a similar way to those of FIGS. 2, 3, and 17, and thus a detailed description thereof will be omitted.

Figure 19:
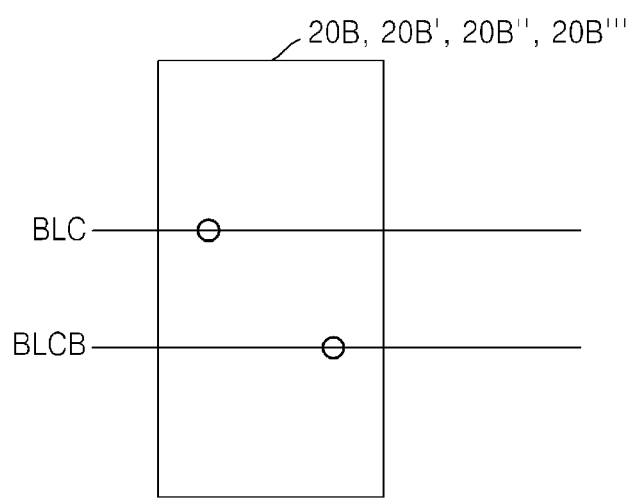
FIG. 19 is a schematic block diagram showing the sense amplifier of FIGS. 15 to 18.

FIG. 19 is a schematic block diagram showing each of the sense amplifiers''' of FIGS. 15 to 18.

Referring to FIG. 19, connection between each of the sense amplifiers 20B, 20W, 20W', and 20B''' and the cell bit line BLC and connection between each of the sense amplifiers 20B, 20W, 20W', and 20B''' and the complementary cell bit line BLCB are simply shown as 'O'. Also, for convenience of description, the bit line BL and the complementary bit line BLB are not shown in the drawing. Furthermore, for convenience of description, the input/output line 10 is not shown in the drawing.

Figure 20:
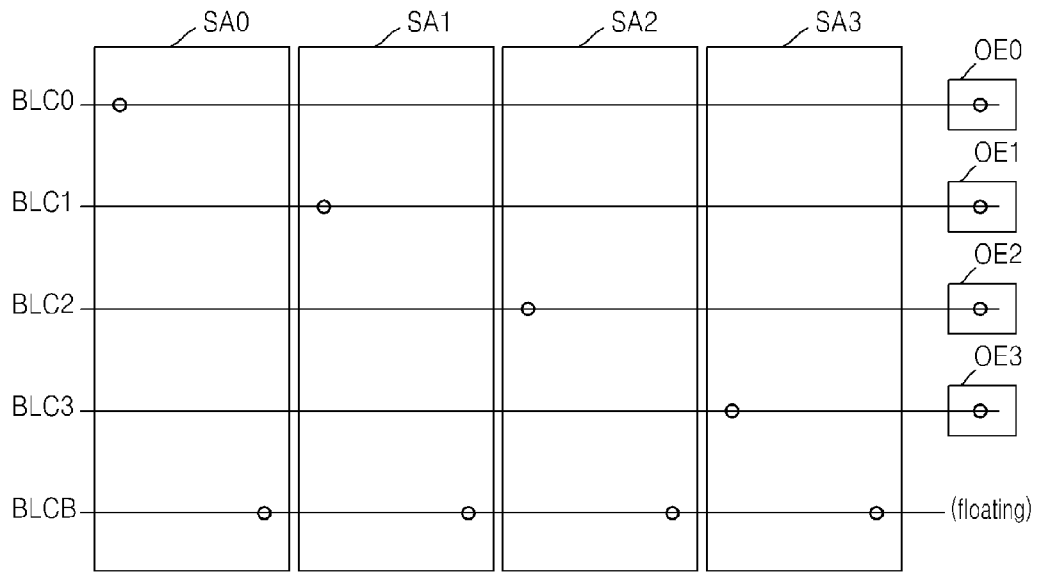
FIG. 20 is a schematic diagram showing an example of arrangement of a plurality of cell bit lines, a complementary bit line, and a plurality of sense amplifiers in a semiconductor memory device including the sense amplifier of FIG. 19.

FIG. 20 is a schematic diagram showing an example of arrangement of a plurality of cell bit lines, a complementary bit line, and a plurality of sense amplifiers in the semiconductor memory device including the sense amplifiers 20B, 20B', 20B", or 20B''' of FIG. 19.

Referring to FIG. 20, the first to fourth sense amplifiers SA0 to SA3 may be disposed above or below the first to fourth cell bit lines BLC0 to BLC3 and the complementary cell bit line BLCB. In detail, the first sense amplifier SA0 may be connected to the first cell bit line BLC0 and the complementary cell bit line BLCB, the second sense amplifier SA1 may be connected to the second cell bit line BLC1 and the complementary cell bit line BLCB, the third sense amplifier SA2 may be connected to the third cell bit line BLC2 and the complementary cell bit line BLCB, and the fourth sense amplifier SA3 may be connected to the fourth cell bit line BLC3 and the complementary cell bit line BLCB.

As such, one of the first to fourth cell bit lines BLC0 to BLC3 may be connected to the corresponding first to fourth sense amplifiers SA0 to SA3 and the complementary cell bit line BLCB. In the current embodiment, only one complementary cell bit line BLCB may be disposed with respect to four cell bit lines, that is, the first to fourth cell bit lines BLC0 to BLC3. However, the present invention is not limited thereto, and thus only one complementary cell bit line BLCB may be disposed with respect to eight cell bit lines, or only one complementary cell bit line BLCB may be disposed with respect to a greater number of cell bit lines.

The first to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, and third output element OE2 may be connected to the third cell bit line BLC2, and the fourth output element OE3 may be connected to the fourth cell bit line BLC3. Here, an additional output element may not be connected to one end of the complementary cell bit line BLCB, and the one end of the complementary cell bit line BLCB may be floated.

Figure 21:
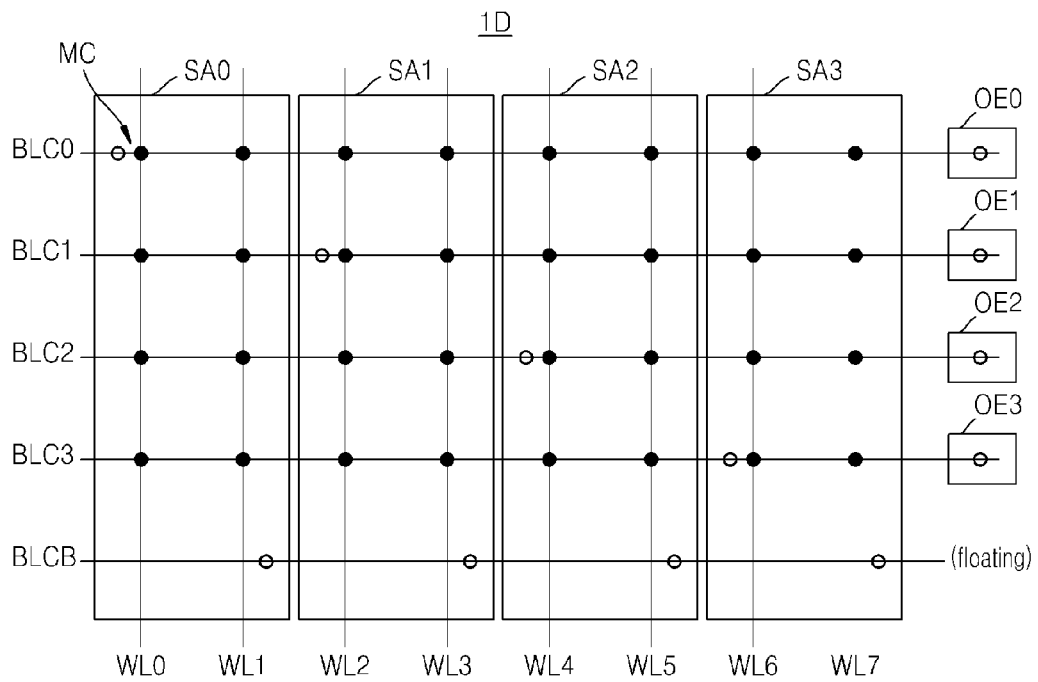
FIG. 21 is a diagram showing a semiconductor memory device having a structure shown in FIG. 20.

FIG. 21 is a diagram showing a semiconductor memory device 1D having a structure shown in FIG. 20.

Referring to FIG. 21, the semiconductor memory device 1D may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC are simply shown as '●'. The memory cells MC may be resistive memory cells such as a PRAM or an RRAM, or may be an NFGM, a PoRAM, an MRAM, a FeRAM, or a flash memory cell.

Figure 22:
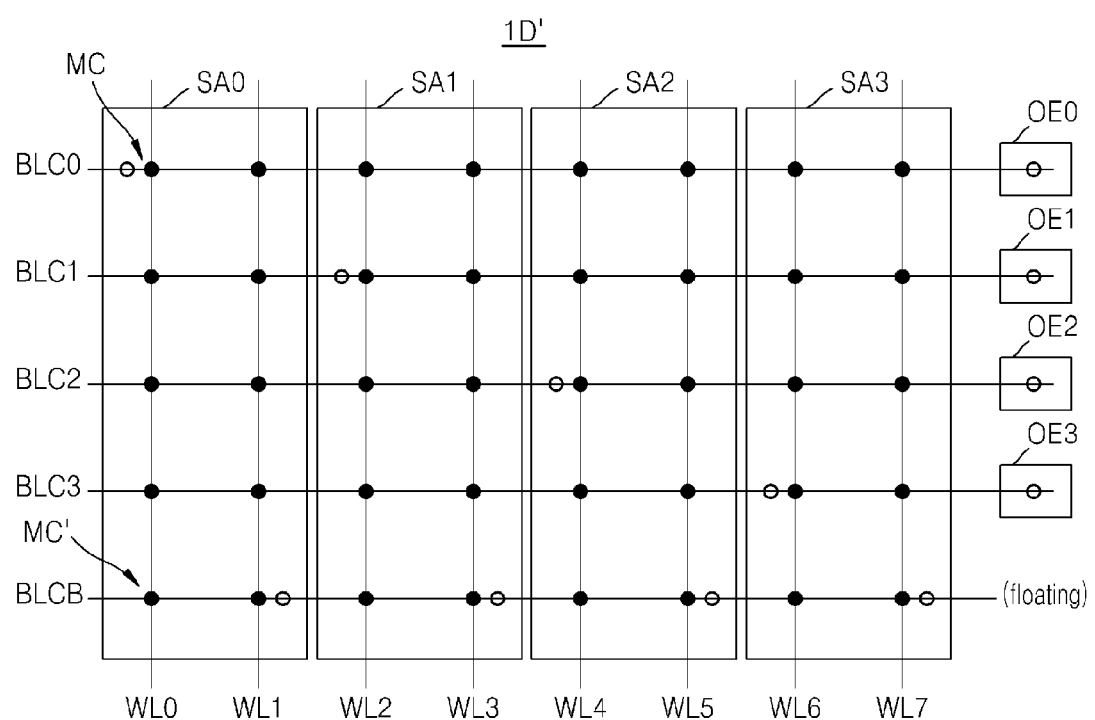
FIG. 22 is a diagram showing a modified example of the semiconductor memory device of FIG. 21.

FIG. 22 is a diagram showing a modified example of the semiconductor memory device 1D of FIG. 21.

Referring to FIG. 22, the semiconductor memory device 1D' may include memory cells MC that are respectively disposed in regions where first to fourth cell bit lines BLC0 to BLC3 and the word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC are simply shown as '●'. The memory cells MC may be volatile memory cells such as DRAMs, may be resistive memory cells such as PRAMs or RRAMs, or may be NFGMs, PoRAMs, MRAMs, FeRAMs, or flash memory cells.

Also, the semiconductor memory device 1D' may further include additional memory cells MC' that are respectively disposed in regions where the complementary cell bit line BLCB and the word lines WL0, WL1, WL2, WL3, WL4, WL5, WL6, and WL7 cross each other. Thus, the memory cell array 10 may further include the additional memory cells MC'. The additional memory cells MC' are simply shown as '●'. The additional memory cells MC' may be volatile memory cells such as DRAMs, may be resistive memory cells such as PRAMs or RRAMs, or may be NFGMs, PoRAMs, MRAMs, FeRAMs, or flash memory cells.

Figure 23:
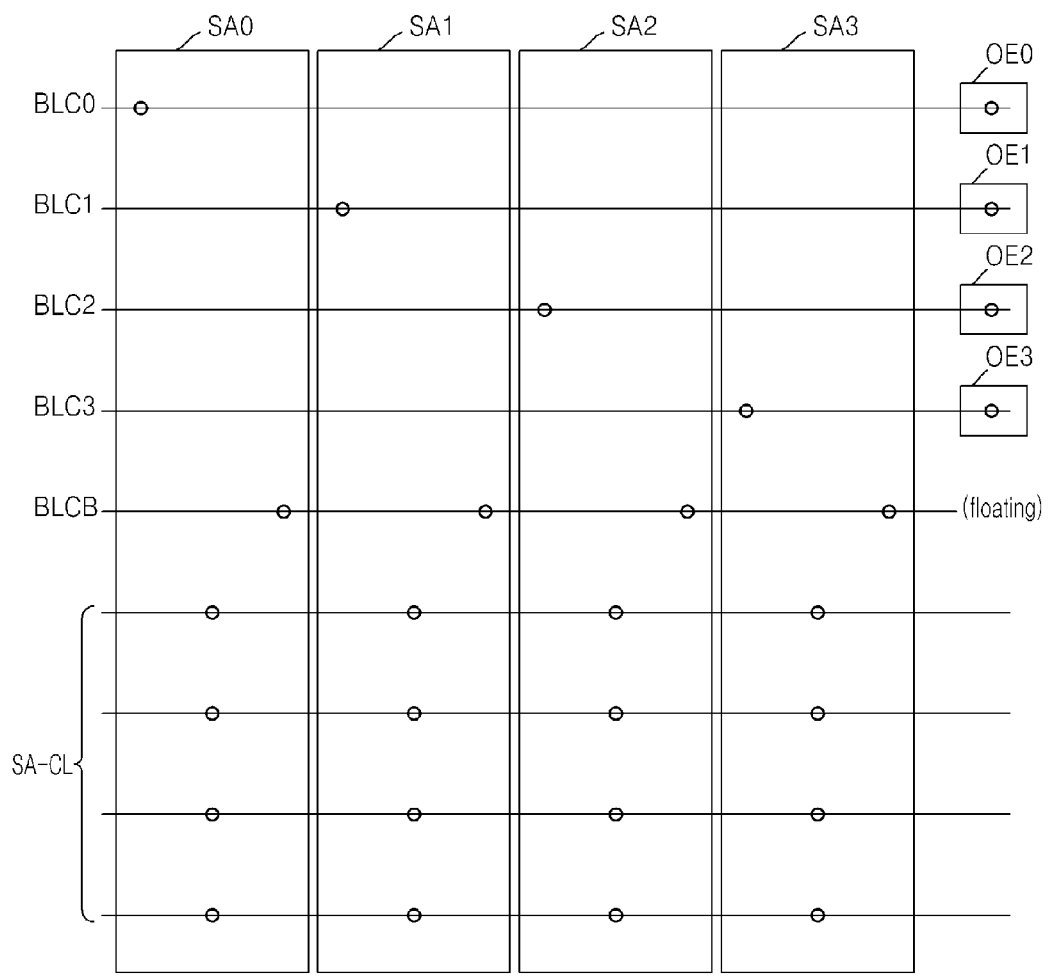
FIG. 23 is a diagram showing another example of arrangement of the plurality of cell bit lines, a complementary cell bit line, a plurality of sense amplifier control lines, and a plurality of sense amplifiers in the semiconductor memory device including the sense amplifier of FIG. 19.

FIG. 23 is a diagram showing another example of arrangement of a plurality of cell bit lines, a complementary cell bit line, a plurality of sense amplifier control lines, and a plurality of sense amplifiers in the semiconductor memory device including the sense amplifiers 20B, 20B', 20B", or 20B''' of FIG. 19.

Referring to FIG. 23, the first to fourth sense amplifiers SA0 to SA3 may be disposed above or below the first to fourth cell bit lines BLC0 to BLC3, the complementary cell bit line BLCB, and the sense amplifier control lines SA_CL. Here, the sense amplifier control lines SA_CL may each provide an equalizing signal EQ, a decompression signal LAB, a boosting signal LA, and a power supply voltage (for example, VCC/2) that are shown in FIGS. 15 to 18. Furthermore, the sense amplifier control lines SA_CL may each provide a P-well voltage and an N-well voltage. However, the number of sense amplifier control lines SA_CL is just an example, and may vary in various ways.

In detail, the first sense amplifier SA0 may be connected to the first cell bit line BLC0, the complementary cell bit line BLCB, and the sense amplifier control lines SA_CL, the second sense amplifier SA1 may be connected to the second cell bit line BLC1, the complementary cell bit line BLCB, and the sense amplifier control lines SA_CL, the third sense amplifier SA2 may be connected to the third cell bit line BLC2, the complementary cell bit line BLCB, and the sense amplifier control lines SA_CL, and the fourth sense amplifier SA3 may be connected to the fourth cell bit line BLC3, the complementary cell bit line BLCB, and the sense amplifier control lines SA_CL.

The first to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3. Here, an additional output element may not be connected to one end of the complementary cell bit line BLCB, and the one end of the complementary cell bit line BLCB may be floated.

Figure 24:
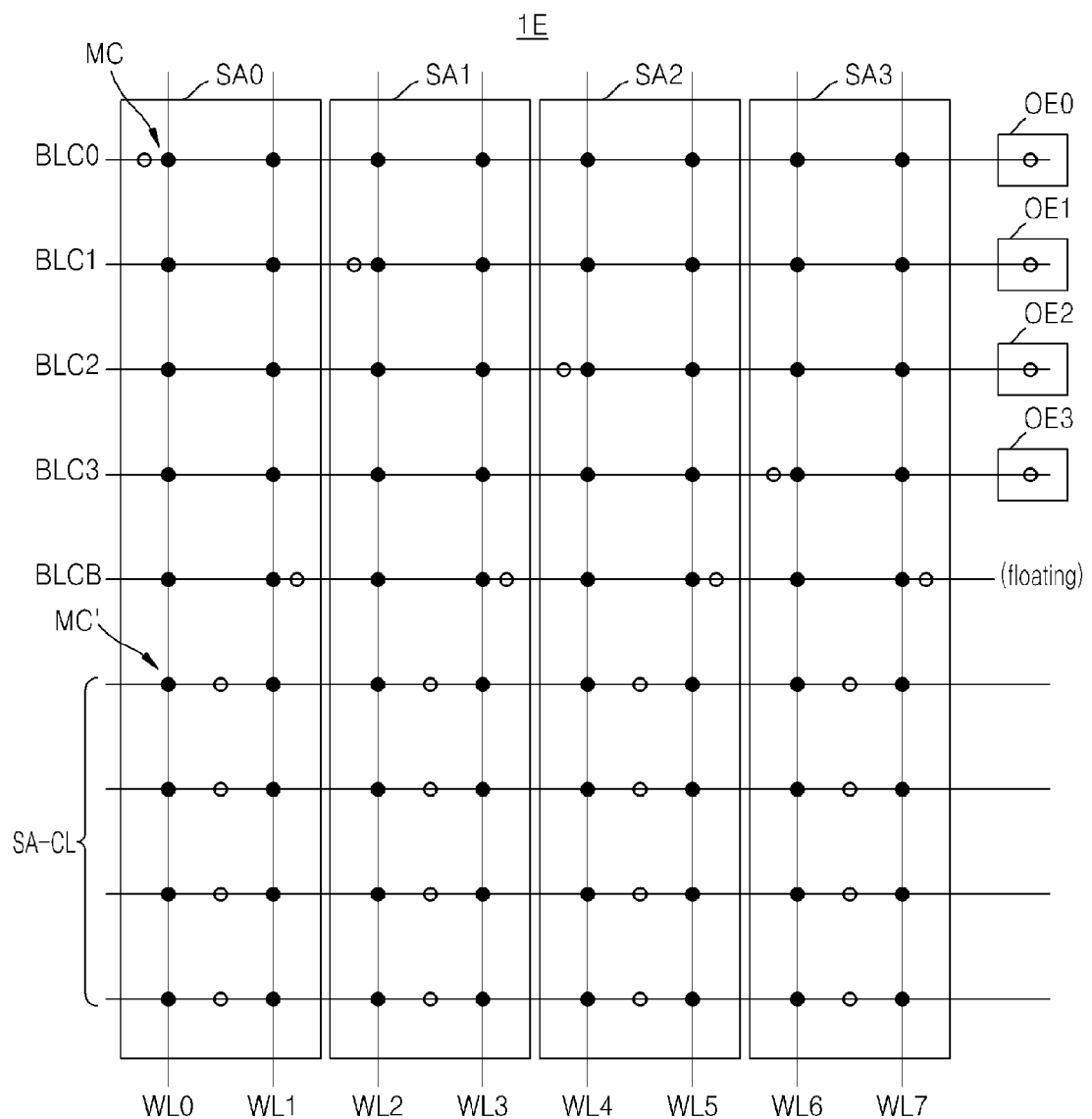
FIG. 24 is a diagram showing a semiconductor memory device having a structure shown in FIG. 23.

FIG. 24 is a diagram showing a semiconductor memory device 1E having a structure shown in FIG. 23.

Referring to FIG. 24, the semiconductor memory device 1E may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC are simply shown as '●'. The memory cells MC may be volatile memory cells such as DRAMs, may be resistive memory cells such as PRAMs or RRAMs, or may be NFGMs, PoRAMs, MRAMs, FeRAMs, or flash memory cells.

Also, the semiconductor memory device 1E may further include a plurality of additional memory cells MC' that are respectively disposed in regions where sense amplifier control lines SA_CL and the word lines WL0, WL1, WL2, WL3, WL4, WL5, WL6, and WL7 cross each other. Thus, the memory cell array 10 may further include the additional memory cells MC'. The plurality of the additional memory cells MC' are simply shown as '●'. The additional memory cells MC' may be volatile memory cells such as DRAMs, may be resistive memory cells such as PRAMs or RRAMs, or may be NFGMs, PoRAMs, MRAMs, FeRAMs, or flash memory cells.

Figure 25:
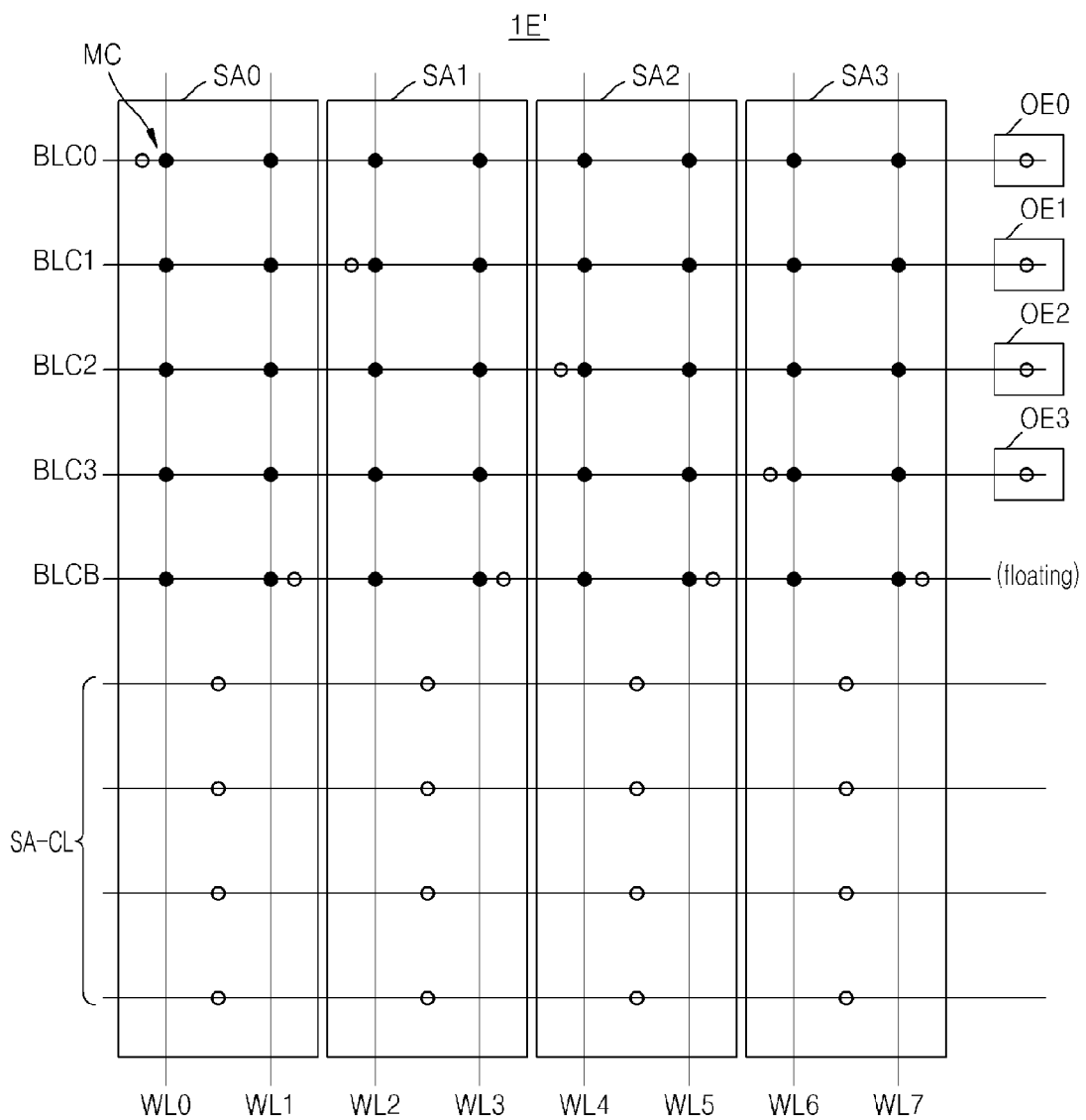
FIG. 25 is a diagram showing a modified example of the semiconductor memory device of FIG. 24.

FIG. 25 is a diagram showing a modified example of the semiconductor memory device 1E of FIG. 24.

Referring to FIG. 25, the semiconductor memory device 1E' may include memory cells MC that are respectively disposed in regions where first to fourth cell bit lines BLC0 to BLC3 and word lines WL0, WL1, WL2, WL3, WL4, WL5, WL6, and WL7 cross each other. The first to fourth cell bit lines BLC0 to BLC3, the word lines WL0, WL1, WL2, WL3, WL4, WL5, WL6, and WL7, and the memory cells MC may constitute the memory cell array 10 of FIG. 1. Here, the memory cells MC are simply shown as '●'. The memory cells MC may be volatile memory cells such as DRAMs, may be resistive memory cells such as PRAMs or RRAMs, or may be NFGMs, PoRAMs, MRAMs, FeRAMs, or flash memory cells.

According to the current embodiment, the semiconductor memory device 1E' may not include a plurality of additional memory cells that are respectively disposed in regions where sense amplifier control lines SA_CL and the word lines WL0, WL1, WL2, WL3, WL4, WL5, WL6, and WL7 cross each other. In detail, the semiconductor memory device 1E' may remove at least one from among components constituting cells except for the first to fourth cell bit lines BLC0 to BLC3 and the word lines WL0, WL1, WL2, WL3, WL4, WL5, WL6, and WL7, thereby reducing an electrical fatigue of the semiconductor memory device 1E' and preventing malfunction of the sense amplifiers SA0 to SA3.

Figure 26:
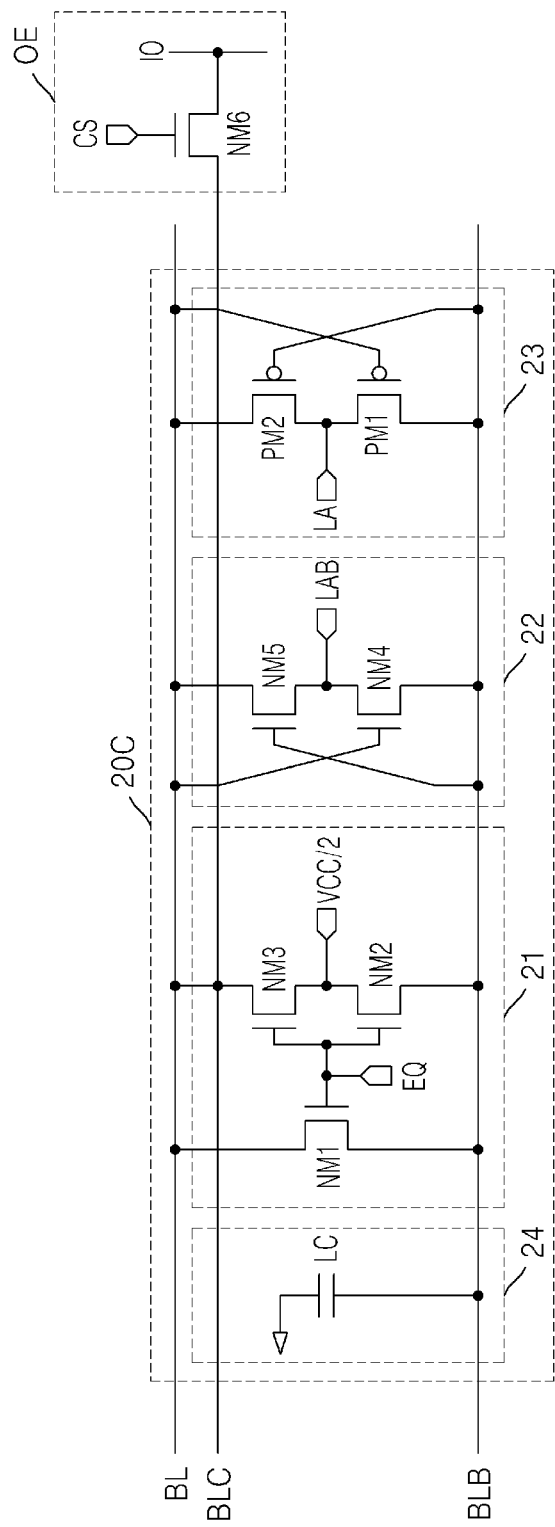
FIG. 26 is a schematic circuit diagram showing another example of the sense amplifier included in the semiconductor memory device of FIG. 1.

FIG. 26 is a schematic circuit diagram showing another example of the sense amplifier SA included in the semiconductor memory device of FIG. 1.

Referring to FIG. 26, a sense amplifier 20C may include an equalizing unit 21, a decompression unit 22, a boosting unit 23, and a loading capacitor 24. The sense amplifier 20C may be used in a memory device including volatile memory cells.

Here, the equalizing unit 21, the decompression unit 22, and the boosting unit 23 may be connected to the bit line BL and the complementary bit line BLB, and the loading capacitor 24 may be connected to the complementary bit line BLB. Here, the equalizing unit 21, the decompression unit 22, the boosting unit 23, and the loading capacitor 24 may be substantially configured in a similar fashion as those shown in FIG. 2, and thus a detailed description thereof will be omitted.

In the current embodiment, the sense amplifier 20C may be disposed above or below the cell bit line BLC and the complementary cell bit line BLCB, and thus the sense amplifier 20C may be overlapped with the memory cell array 10 including the memory cells MC in a planar fashion. In the current embodiment, the cell bit line BLC, the bit line BL, and the complementary bit line BLB may extend parallel to one another in a first direction. Also, the equalizing unit 21, the decompression unit 22, the boosting unit 23, and the loading capacitor 24 included in the sense amplifier 20C may be disposed adjacent to one another in the first direction. The sense amplifier 20C may have an open bit line sense amplifier structure.

Figure 27:
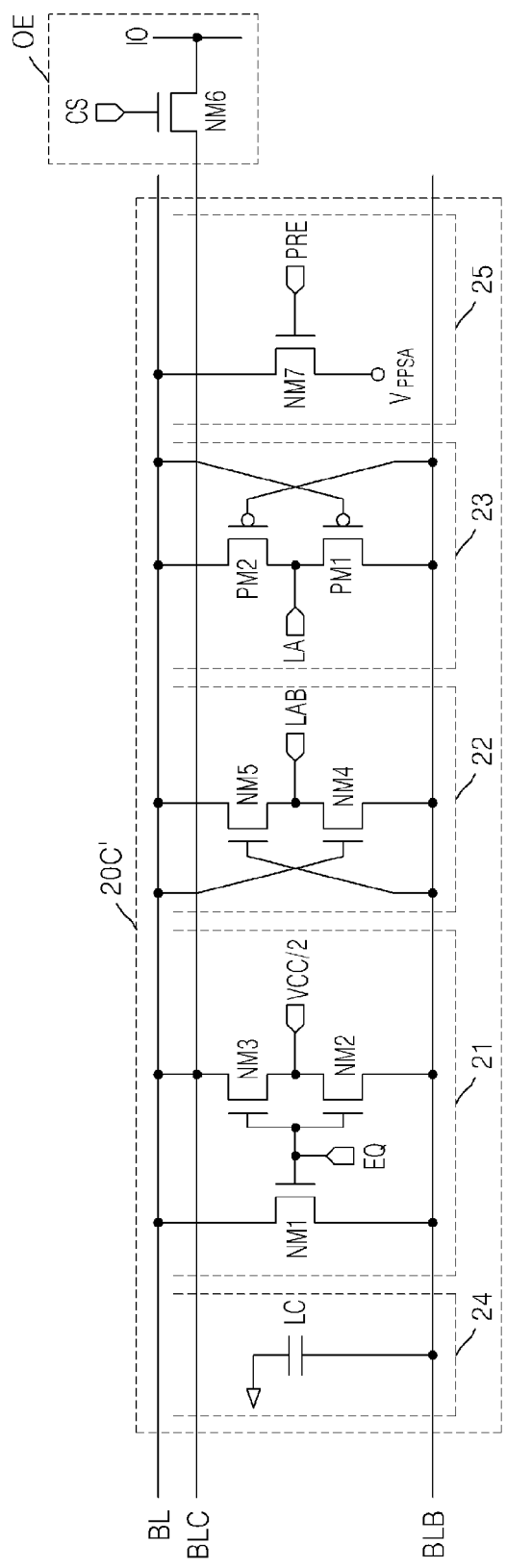
FIG. 27 is a schematic circuit diagram showing a modified example of the sense amplifier of FIG. 26.

FIG. 27 is a schematic circuit diagram showing a modified example of the sense amplifier 20C of FIG. 26.

Referring to FIG. 27, a sense amplifier 20C' may include an equalizing unit 21, a decompression unit 22, a boosting unit 23, a loading capacitor 24, and a precharging unit 25. Comparing the sense amplifier 20C' of FIG. 27 with the sense amplifier 20C of FIG. 26, the sense amplifier 20C' may further include the precharging unit 25. Thus, the sense amplifier 20C' may be used in a semiconductor memory device including non-volatile memory cells. Here, the equalizing unit 21, the decompression unit 22, the boosting unit 23, the loading capacitor 24, and the precharging unit 25 may be substantially configured in a similar way to those of FIGS. 2, 3, and 26, and thus a detailed description thereof will be omitted.

Figure 28:
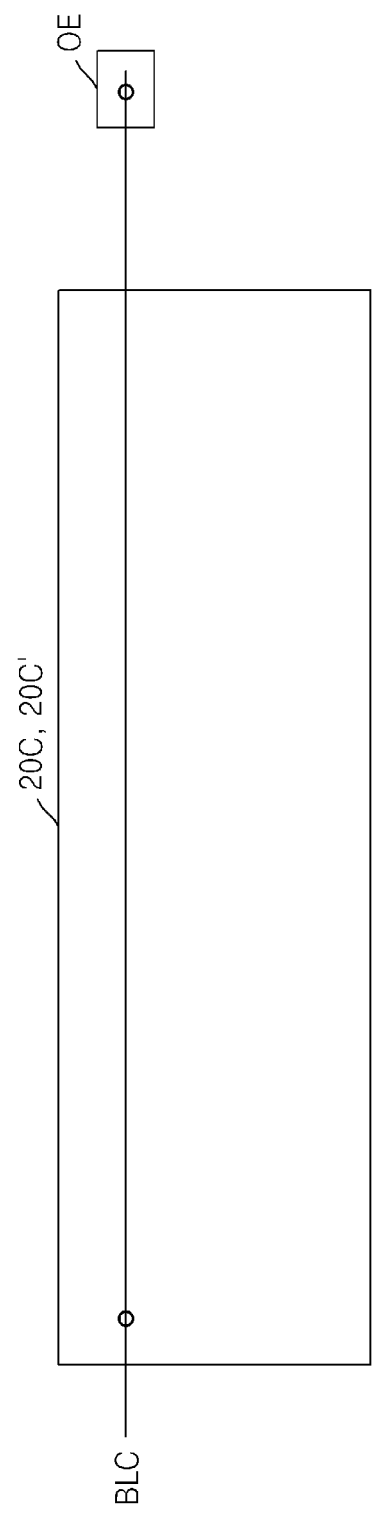
FIG. 28 is a schematic diagram showing the sense amplifier of FIGS. 26 and 27.

FIG. 28 is a schematic diagram showing each of the sense amplifiers 20C and 20C' of FIGS. 26 and 27.

Referring to FIG. 28, connections between each of the sense amplifiers 20C and 20C' and the cell bit line BLC and between the output element OE and the cell bit line BLC are simply shown as 'O'. Also, for convenience of description, a bit line BL and a complementary bit line BLB are not shown in the drawing. Furthermore, for convenience of description, an input/output line 10 is not shown in the drawing.

Figure 29:
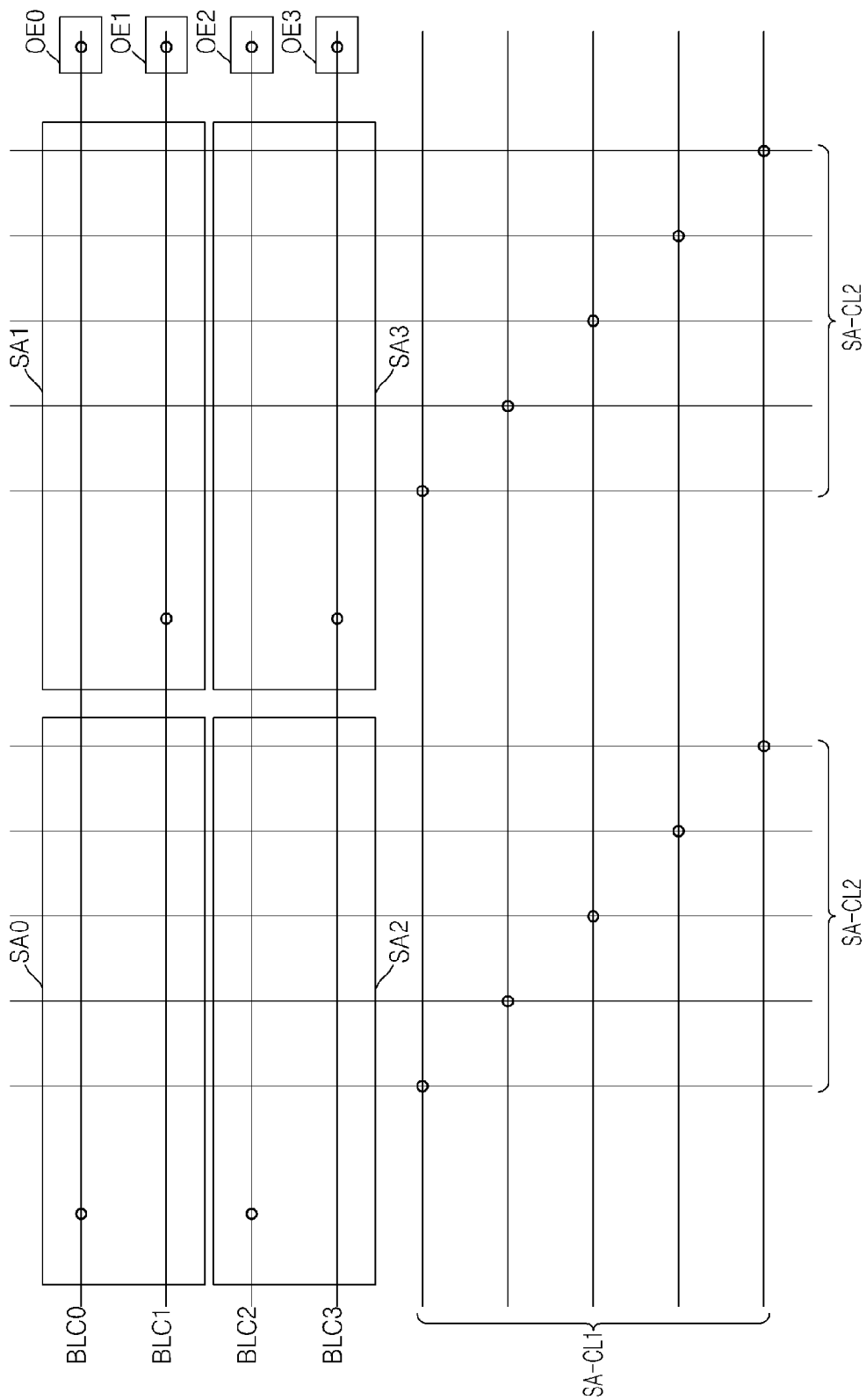
FIG. 29 is a schematic diagram showing an example of arrangement of a plurality of memory cells, a plurality of first sense amplifier control lines, a plurality of second sense amplifier control lines, and a plurality of sense amplifiers in a semiconductor memory device including the sense amplifier of FIG. 28.

FIG. 29 is a schematic diagram showing an example of arrangement of a plurality of memory cells, a plurality of first sense amplifier control lines, a plurality of second sense amplifier control lines, and a plurality of sense amplifiers in the semiconductor memory device including the sense amplifiers 20C or 20C' of FIG. 28.

Referring to FIG. 29, the first to fourth cell bit lines BLC0 to BLC3 and the first sense amplifier control lines SA_CL1 may be disposed parallel to each other in a first direction, and the word lines and the second sense amplifier control lines SA_CL2 may be disposed parallel to each other in a second direction perpendicular to the first direction. Here, the first sense amplifier control lines SA_CL1 may each provide an equalizing signal EQ, a decompression signal LAB, a boosting signal LA, and a power supply voltage (for example, VCC/2). Furthermore, the first sense amplifier control lines SA_CL1 may each provide a P-well voltage and an N-well voltage. However, the number of first sense amplifier control lines SA_CL1 is just an example, and may vary in various ways. The second sense amplifier control lines SA_CL2 may be connected to the first sense amplifier control lines SA_CL1, respectively.

The first to fourth sense amplifiers SA0 to SA3 may be disposed above or below the first to fourth cell bit lines BLC0 to BLC3 and the second sense amplifier control lines SA_CL2. In detail, the first sense amplifier SA0 may be disposed above or below regions where the first cell bit line BLC0 and some of the second sense amplifier control lines SA_CL2 cross each other. Also, the second sense amplifier SA1 may be disposed above or below regions where the second cell bit line BLC1 and the rest of the second sense amplifier control lines SA_CL2 cross each other. Also, the third sense amplifier SA2 may be disposed above or below regions where the third cell bit line BLC2 and some of the second sense amplifier control lines SA_CL2 cross each other. Also, the fourth sense amplifier SA3 may be disposed above or below regions where the fourth cell bit line BLC3 and the rest of the second sense amplifier control lines SA_CL2 cross each other.

The first to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3.

Figure 30:
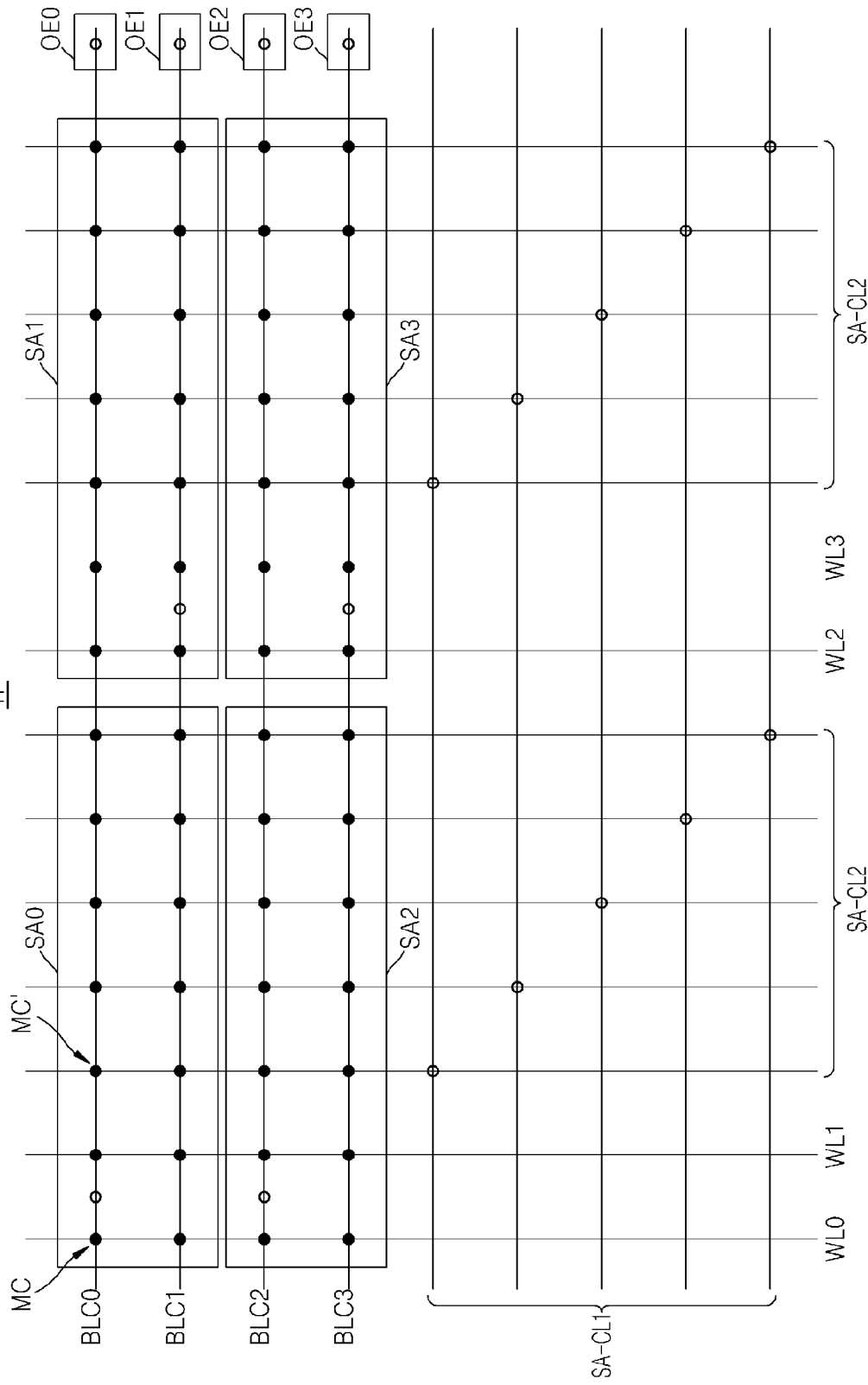
FIG. 30 is a diagram showing a semiconductor memory device having a structure shown in FIG. 29.

FIG. 30 is a diagram showing a semiconductor memory device 1F having a structure shown in FIG. 29.

Referring to FIG. 30, the semiconductor memory device 1F may include memory cells MC that are respectively disposed in regions where first to fourth cell bit lines BLC0 to BLC3 and word lines WL0, WL1, WL2, and WL3 cross each other.

The first to fourth cell bit lines BLC0 to BLC3, the word lines WL0, WL1, WL2, and WL3, and the memory cells MC may constitute the memory cell array 10 of FIG. 1. Here, the memory cells MC are simply shown as '●'. The memory cells MC may be volatile memory cells such as DRAMs, may be resistive memory cells such as PRAMs or RRAMs, or may be NFGMs, PoRAMs, MRAMs, FeRAMs, or flash memory cells.

Also, the semiconductor memory device 1F may further include additional memory cells MC' that are respectively disposed in regions where the first to fourth cell bit lines BLC0 to BLC3 and second sense amplifier control lines SA_CL2 cross each other. Thus, the memory cell array 10 may further include the additional memory cells MC'. Here, the additional memory cells MC' are simply shown as '●'. The additional memory cells MC' may be volatile memory cells such as DRAMs, may be resistive memory cells such as PRAMs or RRAMs, or may be NFGMs, PoRAMs, MRAMs, FeRAMs, or flash memory cells.

Figure 31:
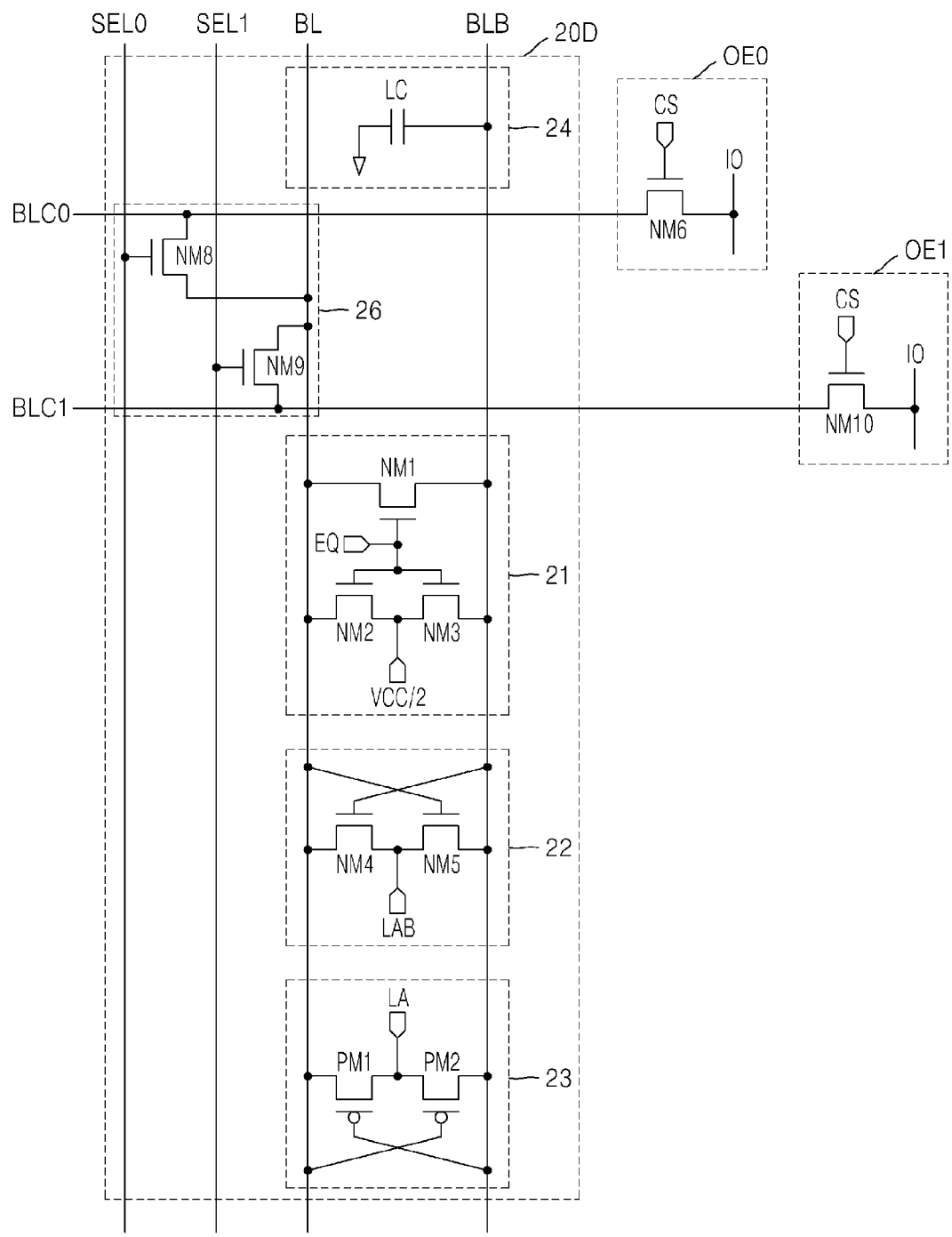
FIG. 31 is a schematic circuit diagram showing another example of the sense amplifier included in the semiconductor memory device of FIG. 1.

FIG. 31 is a schematic circuit diagram showing another example of the sense amplifier SA included in the semiconductor memory device of FIG. 1.

Referring to FIG. 31, a sense amplifier 20D may include an equalizing unit 21, a decompression unit 22, a boosting unit 23, a loading capacitor 24, and a selecting unit 26. The sense amplifier 20D may be used in a semiconductor memory device including volatile memory cells.

Here, the equalizing unit 21, the decompression unit 22, and the boosting unit 23 may be connected to a bit line BL and a complementary bit line BLB. The loading capacitor 24 may be connected to the complementary bit line BLB. Here, the equalizing unit 21, the decompression unit 22, the boosting unit 23, and the loading capacitor 24 may be substantially configured in a similar fashion as those shown in FIG. 2, and thus a detailed description thereof will be omitted.

The selecting unit 26 may be connected to the first and second cell bit lines BLC0 and BLC1 so as to connect one of the first and second cell bit lines BLC0 and BLC1 to the bit line BL. In detail, the selecting unit 26 may include first and second clamp transistors NM8 and NM9. The first clamp transistor NM8 may be configured as an NMOS transistor having a drain connected to the first cell bit line BLC0, a source connected to the bit line BL, and a gate to which a first selection signal SEL0 is applied. Also, the second clamp transistor NM9 may be configured as an NMOS transistor having a drain connected to the second cell bit line BLC1, a source connected to the bit line BL, and a gate to which a second selection signal SEL1 is applied.

If the first selection signal SEL0 is enabled, the first clamp transistor NM8 is turned on, and thus the first cell bit line BLC0 may be connected to the bit line BL. Meanwhile, if the second selection signal SEL1 is enabled, the second clamp transistor NM9 is turned on, and thus the second cell bit line BLC1 may be connected to the bit line BL. As such, according to the current embodiment, one of the first and second cell bit lines BLC0 and BLC1 may be connected to the bit line BL by controlling the first and second selection signals SEL0 and SEL1.

Thus, since the sense amplifier SA may perform sensing on the first and second cell bit lines BLC0 and BLC1, only one sense amplifier SA may be disposed with respect to the first and second cell bit lines BLC0 and BLC1, and thus the entire area of the semiconductor memory device may be reduced, thereby improving integration of the semiconductor memory device.

In the above description, only one sense amplifier is disposed with respect to two cell bit lines, but the present invention is not limited thereto. Alternatively, only one sense amplifier may be disposed with respect to one or at least three cell bit lines.

In the current embodiment, the sense amplifier 20D may be disposed above or below the first and second cell bit lines BLC0 and BLC1, and thus the sense amplifier 20D may be overlapped with the memory cell array 10 including the memory cells MC in a planar fashion. In the current embodiment, the first and second cell bit lines BLC0 and BLC1 may be disposed parallel to each other in a first direction, and the bit line BL and the complementary bit line BLB may be disposed parallel to each other in a second direction perpendicular to the first direction. Also, the equalizing unit 21, the decompression unit 22, the boosting unit 23, the loading capacitor 24, and the selecting unit 26 included in the sense amplifier 20D may be disposed adjacent to one another in the first direction.

Figure 32:
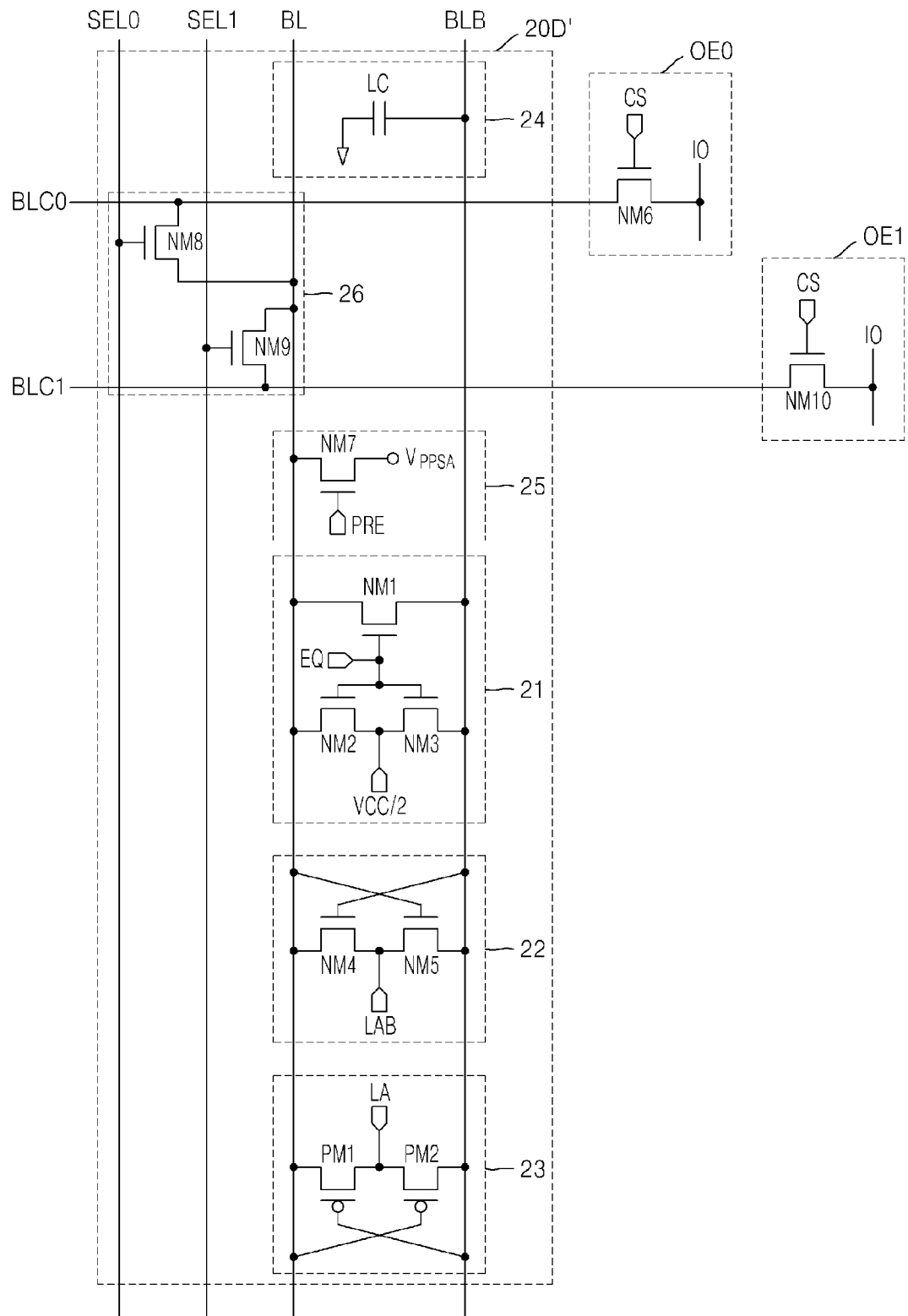
FIG. 32 is a schematic circuit diagram showing a modified example of the sense amplifier of FIG. 31.

FIG. 32 is a schematic circuit diagram showing a modified example of the sense amplifier 20D of FIG. 31.

Referring to FIG. 32, the sense amplifier 20D' may include an equalizing unit 21, a decompression unit 22, a boosting unit 23, a loading capacitor 24, a selecting unit 26, and a precharging unit 25. Comparing the sense amplifier 20D' of FIG. 32 with the sense amplifier 20D of FIG. 31, the sense amplifier 20D' may further include the precharging unit 25. Thus, the sense amplifier 20D' may be used in a semiconductor memory device including non-volatile memory cells. Here, the equalizing unit 21, the decompression unit 22, the boosting unit 23, the loading capacitor 24, the selecting unit 26, and the precharging unit 25 may be substantially configured in a similar fashion as those shown in FIGS. 2, 3, and 31, and thus a detailed description thereof will be omitted.

Figure 33:
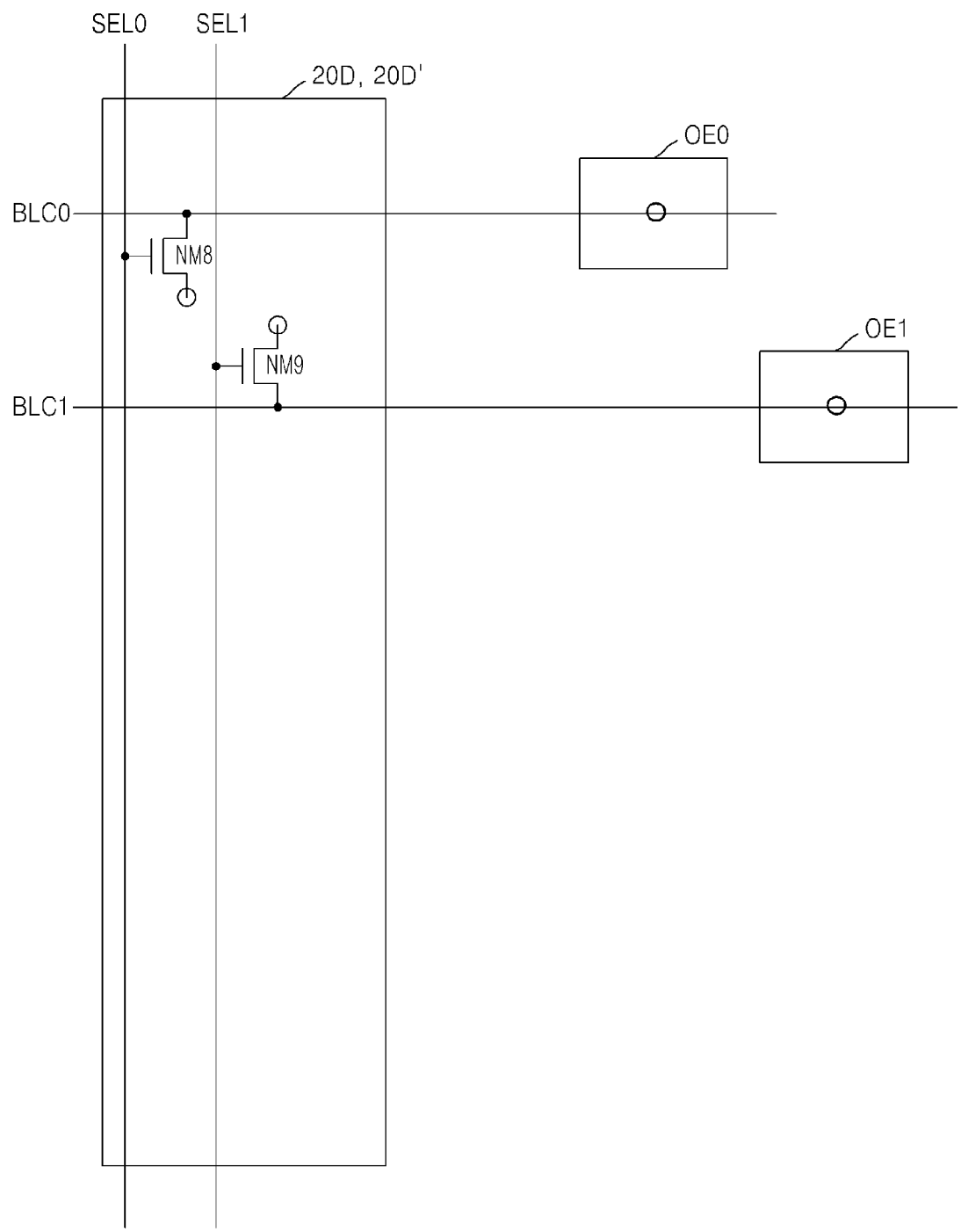
FIG. 33 is a schematic block diagram showing the sense amplifier of FIGS. 31 and 32.

FIG. 33 is a schematic block diagram showing each of the sense amplifiers 20D and 20D' of FIGS. 31 and 32.

Referring to FIG. 33, connection between each of the first and second clamp transistors NM8 and NM9, respectively connected to the first and second cell bit lines BLC0 and BLC1, and a sense amplifier 20D or 20D', and connection between each of the first and second cell bit lines BLC0 and BLC1 and each of the output elements OE0 and OE1 are simply shown as 'O'. Also, for convenience of description, a bit line BL and a complementary bit line BLB are not shown in the drawing. Furthermore, for convenience of description, an input/output line IO is not shown in the drawing.

Figure 34:
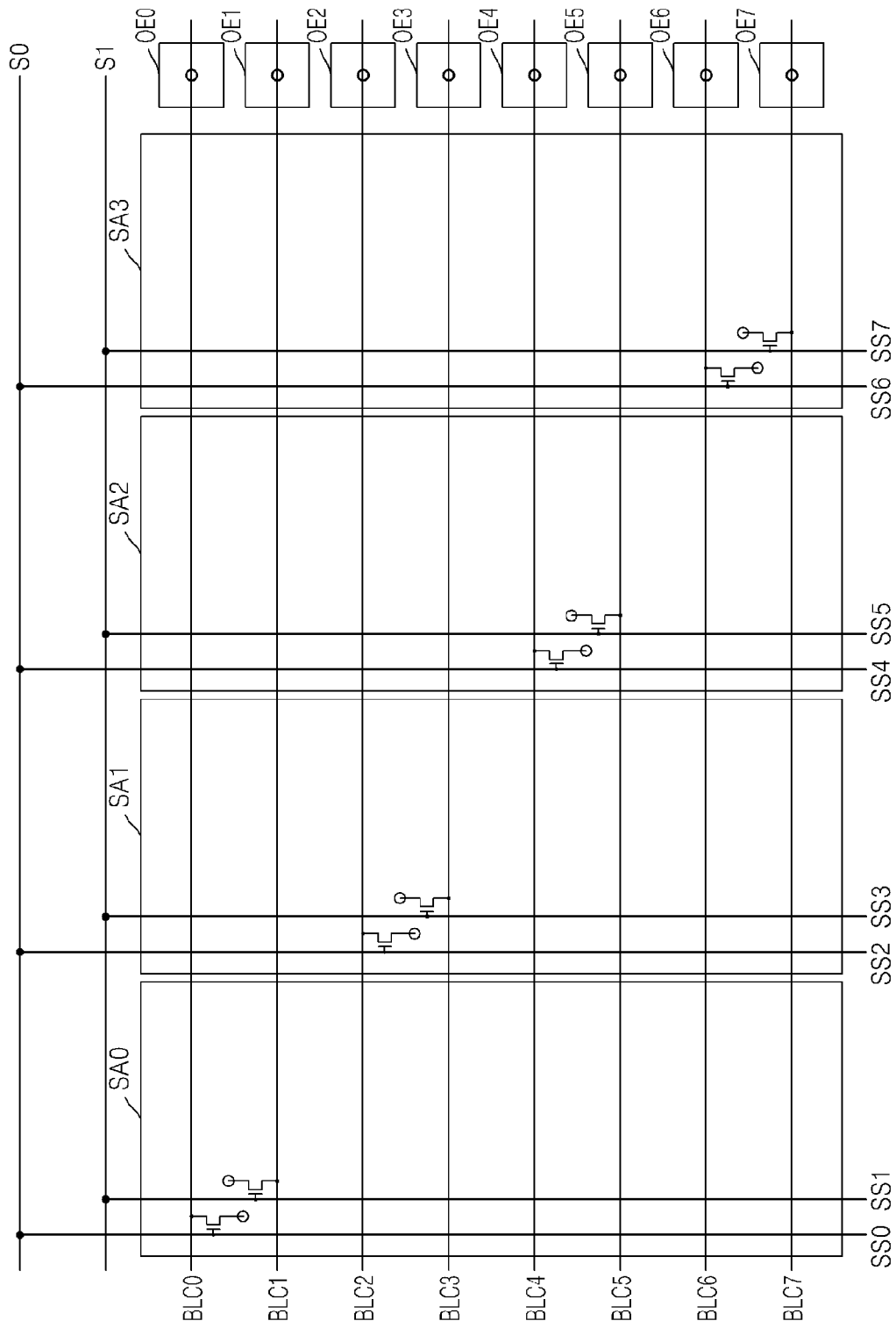
FIG. 34 is a schematic diagram showing an example of arrangement of a plurality of cell bit lines, a plurality of selection lines, and a plurality of sense amplifiers in a semiconductor memory device including the sense amplifier of FIG. 33.

FIG. 34 is a schematic diagram showing an example of arrangement of a plurality of cell bit lines, a plurality of selection lines, and a plurality of sense amplifiers in the semiconductor memory device including each of the sense amplifiers 20D and 20D' of FIG. 33.

Referring to FIG. 34, a plurality of first to eighth cell bit lines BLC0 to BLC7 may be disposed parallel to one another in a first direction, and first and second selection lines S0 and S1 respectively providing the first and second selection signals may be disposed parallel to each other in the first direction. Here, a plurality of sub-selection lines SS0, SS1, SS2, SS3, SS4, SS5, SS6, and SS7 may be disposed parallel to one another in a second direction perpendicular to the first direction, and may be connected to the first and second selection lines S0 and S1. In detail, the sub-selection lines SS0, SS2, SS4, and SS6 may be connected to the first selection line S0, and the sub-selection lines SS1, SS3, SS5, and SS7 may be connected to the second selection line S1.

The first to fourth sense amplifiers SA0 to SA3 may be disposed above or below the first to eighth cell bit lines BLC0 to BLC7.

The first to fourth output elements OE0 to OE3 may be connected to the first to fourth cell bit lines BLC0 to BLC3, respectively. In detail, the first output element OE0 may be connected to the first cell bit line BLC0, the second output element OE1 may be connected to the second cell bit line BLC1, the third output element OE2 may be connected to the third cell bit line BLC2, and the fourth output element OE3 may be connected to the fourth cell bit line BLC3.

Figure 35:
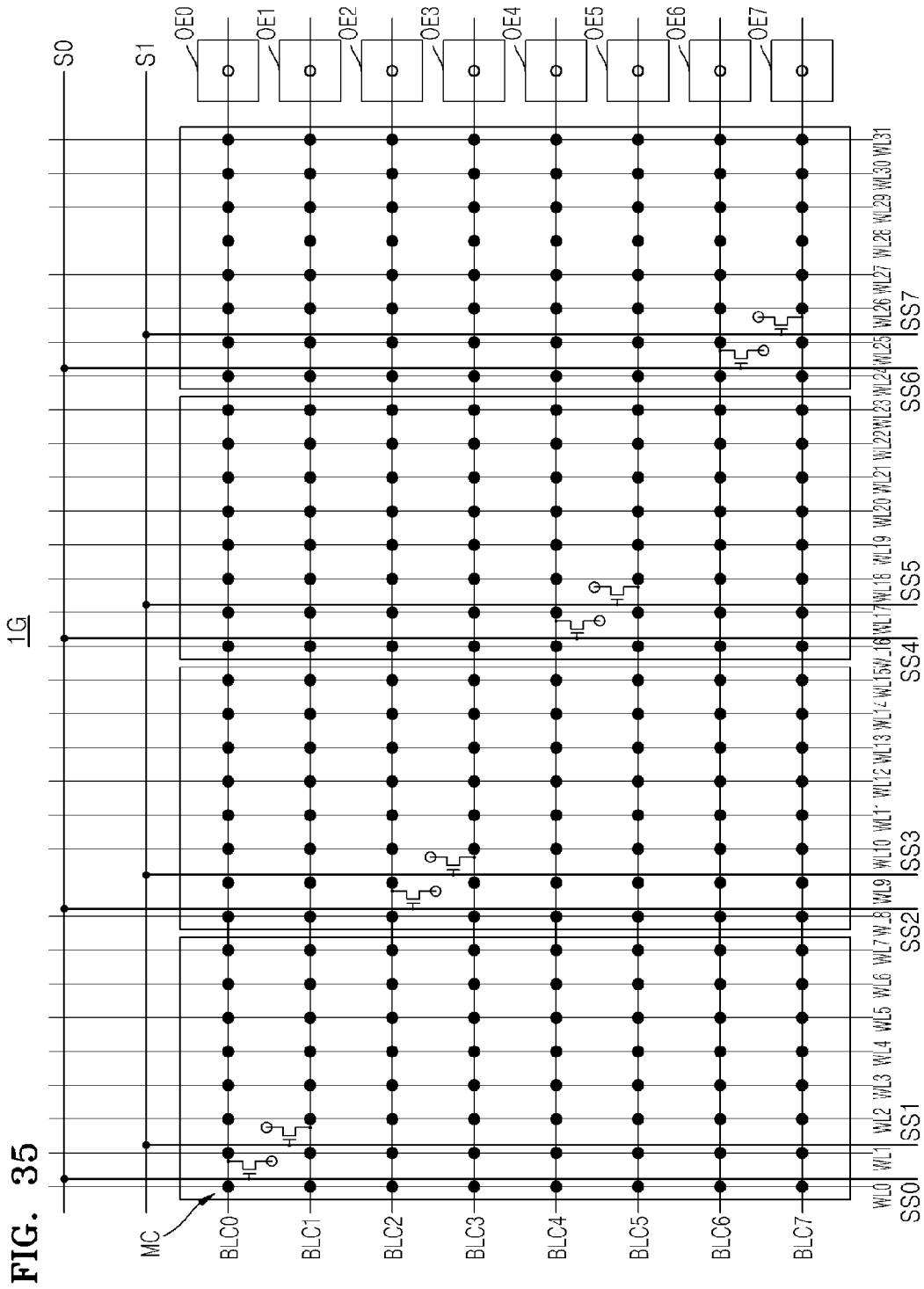
FIG. 35 is a diagram showing a semiconductor memory device having a structure shown in FIG. 34.

FIG. 35 is a diagram showing a semiconductor memory device 1G having a structure shown in FIG. 34.

Referring to FIG. 35, the semiconductor memory device 1G may include a plurality of memory cells MC that are respectively disposed in regions where first to eighth cell bit lines BLC0 to BLC7 and first to thirty second word lines WL0 to WL31 cross each other. The first to eighth cell bit lines BLC0 to BLC7, the first to thirty second word lines WL0 to WL31, and the memory cells MC may constitute the memory cell array 10 of FIG. 1. Here, the memory cells MC are simply shown as '●'. The memory cells MC may be volatile memory cells such as a DRAM, may be resistive memory cells such as PRAMs or RRAMs, or may be NFGMs, PoRAMs, MRAMs, FeRAMs, or flash memory cells.

Figure 36:
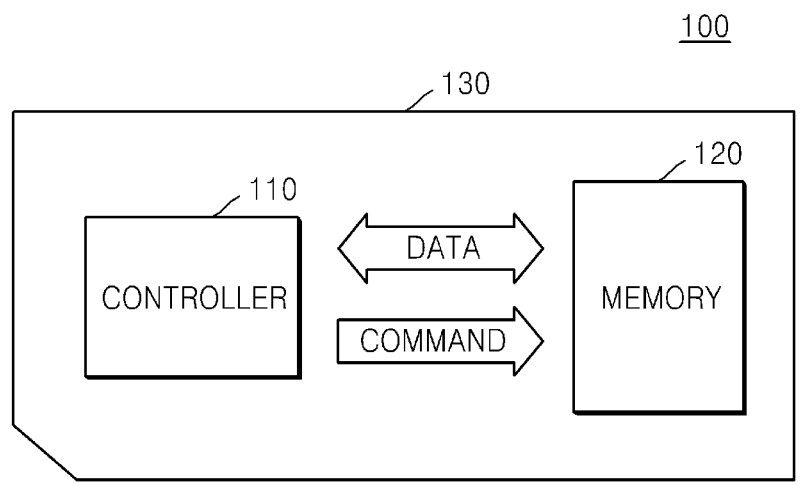
FIG. 36 is a schematic block diagram of a memory card according to an embodiment of the present invention.

FIG. 36 is a schematic block diagram of a memory card 100 according to an embodiment of the present invention.

Referring to FIG. 36, the memory card 100 includes a housing 130, and a controller 110 and a memory 120 that are disposed in the housing 130 to exchange an electrical signal. For example, when the controller 110 sends a command, the memory 120 may transmit data. The memory 120 may include any one of semiconductor memory devices of the above-described embodiments.

The memory card 100 may be used in various types of cards, for example, a memory device such as a memory stick card, a smart media (SM) card, a secure digital (SD) card, or a mini SD card, or a multi media card (MMC).

Figure 37:
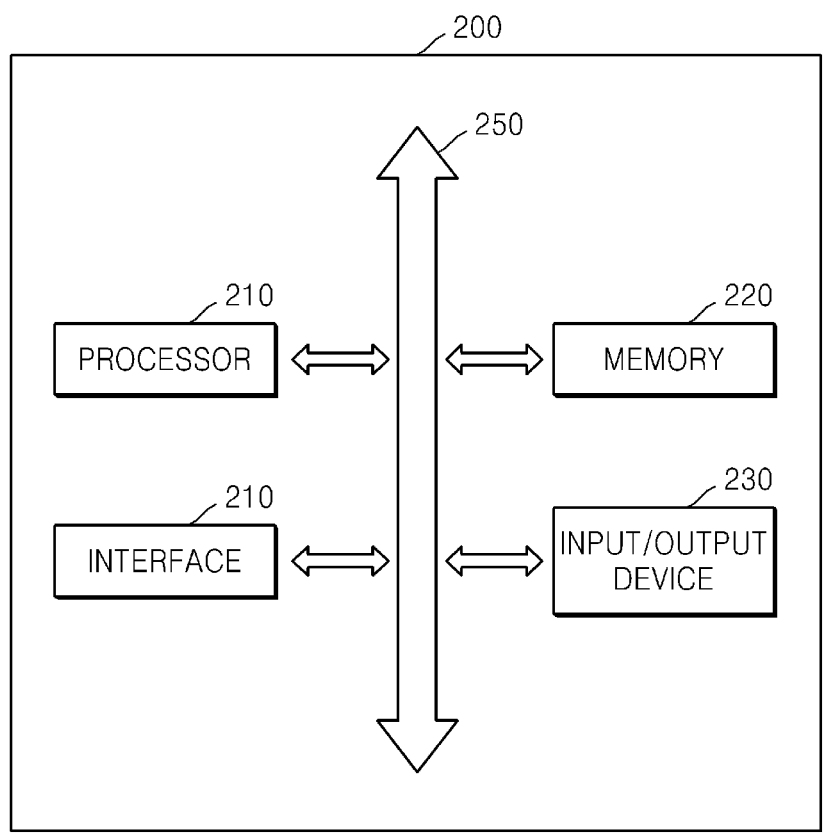
FIG. 37 is a schematic block diagram of an electronic system according to an embodiment of the present invention.

FIG. 37 is a schematic block diagram of an electronic system 200 according to an embodiment of the present invention.

Referring to FIG. 37, the electronic system 200 may include a processor 210, a memory 220, an input/output device 230, and an interface 240. The electronic system 200 may be a mobile system or a system that sends and receives information. The mobile system may be a personal digital assistant (PDA), a portable computer, a web tablet, a wireless phone, a mobile phone, a digital music player, or a memory card.

The processor 210 may execute a program and control the electronic system 200. The processor 210 may be, for example, a microprocessor, a digital signal processor, a microcontroller, or a similar device thereto.

The input/output device 230 may input or output the data of the electronic system 200. The electronic system 200 may exchange data with an external device by using the input/output device 230 via, for example, a personal computer (PC) or a network. Here, the input/output device 230 may be, for example, a keypad, a keyboard, or a display device.

The memory 220 may store a code and/or data for operating the processor 210, and/or may store data processed by the processor 210. Here, the memory 220 may include any one of semiconductor memory devices of the above-described embodiments.

The interface 240 may be a path for transmitting data between the electronic system 200 and an external device. The processor 210, the memory 230, the input/output device 230, and the interface 240 may communicate with one another via a bus 250.

For example, the electronic system 200 may be used in a mobile phone, a moving picture experts group (MPEG) audio layer-3 (MP3), a navigation device, a portable multimedia player (PMP), a solid state drive (SSD), or household appliances.

According to one or more embodiments of the present invention, sense amplifiers may be disposed above or below a memory cell array in a semiconductor memory device, and thus the sense amplifiers may be overlapped with the memory cell array in a planar fashion. Thus, the semiconductor memory device may reduce an area of the sense amplifiers in the semiconductor memory device, thereby significantly improving integration of the semiconductor memory device.

Also, even though a pitch of cell bit lines is reduced, the sense amplifiers may be easily configured without using a high-resolution exposing device. In addition, since complementary bit lines may be disposed in the sense amplifiers, noise may be prevented from being generated between adjacent memory cells by the complementary bit lines.

Furthermore, some of cell bit lines or word lines may be used as sense amplifier control lines for providing control signals for driving the sense amplifiers. Thus, since there is no need to perform an additional process for forming the sense amplifier control lines, a process may be simplified.

Also, the memory cells are not disposed on the sense amplifier control lines, and thus an electrical fatigue of the semiconductor memory device may be reduced, thereby preventing malfunction of the sense amplifiers.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A semiconductor memory device comprising:
  a memory cell array that is disposed at a first layer and comprises at least one word line, at least one cell bit line, and at least one memory cell which is disposed in a region where the at least one word line and the at least one cell bit line cross each other;
  at least one sense amplifier configured to sense data stored in the at least one memory cell, the at least one sense amplifier being disposed at a second layer different from the first layer and connected to at least one bit line and at least one complementary bit line, the at least one bit line being connected to the at least one cell bit line,
  at least one output device that is connected to the at least one cell bit line,
  wherein the bit line is connected to the output device via the cell bit line,
  wherein the memory cell array is overlapped with the at least one sense amplifier in a planar fashion, the at least one output device is connected to the at least one sense amplifier so as not to be overlapped with the memory cell array and the at least one sense amplifier in a planar fashion, and the at least one output device transmits a signal of the at least one bit line to an output line.

2. The semiconductor memory device of claim 1, wherein the at least one sense amplifier further comprises a loading capacitor that is connected to the complementary bit line.

3. The semiconductor memory device of claim 1, wherein the memory cell array further comprises at least one complementary cell bit line that is connected to the at least one complementary bit line and extends in a direction in which the cell bit line extends, and one end of the at least one complementary cell bit line is floated.

4. The semiconductor memory device of claim 1, wherein the memory cell array further comprise at least one complementary cell bit line that is connected to the at least one complementary bit line and extends in a direction in which the cell bit line extends, and one end of the at least one complementary cell bit line is floated, wherein the at least one sense amplifier further comprises the loading capacitor connected to the complementary bit line.

5. The semiconductor memory device of claim 4, wherein the memory cell array further comprise at least one first sense amplifier control line that provides a plurality of control signals to the at least one sense amplifier and extends in a direction of the cell bit line.

6. The semiconductor memory device of claim 5, wherein the memory cell array further comprises at least one additional memory cell that is disposed in a region where the at least one first sense amplifier control line and the at least one word line cross each other.

7. The semiconductor memory device of claim 6, wherein the memory cell array further comprises at least one second sense amplifier control line that is connected to the at least one first sense amplifier control line and extends in a direction perpendicular to a direction of the cell bit line.

8. The semiconductor memory device of claim 1, wherein the at least one cell bit line, the at least one bit line, and the at least one complementary bit line extend parallel to each other in the first direction, and the at least one word line extends in the second direction perpendicular to the first direction.

9. The semiconductor memory device of claim 1, wherein the at least one cell bit line is a plurality of cell bit lines, and the at least one sense amplifier is connected to at least two cell bit lines among the plurality of cell bit lines and further comprises a selecting unit for connecting one of the at least two cell bit lines to the at least one bit line.

10. The semiconductor memory device of claim 9, wherein the selecting unit comprises:
  a first switching device that is connected between one of the at least two cell bit lines and the at least one bit line and is turned on/off according to a first selection signal; and
  a second switching device that is connected between the other one of the at least two cell bit lines and the at least one bit line and turned on/off according to a second selection signal.

11. The semiconductor memory device of claim 1, wherein the at least one sense amplifier further comprises a precharging unit for precharging the at least one bit line to a precharge voltage.

12. A memory card comprising:
  a memory unit comprising the semiconductor memory device of claim 1; and
  a controller for controlling the memory unit.

13. An electronic system comprising:
  a memory unit comprising the semiconductor memory device of claim 1;
  a processor communicated with the memory unit via a bus; and
  an input/output device communicated with the bus.

14. The semiconductor memory device of claim 1, wherein the at least one cell bit line extends in a first direction, and the at least one word line, the at least one bit line, and the at least one complementary bit line extend parallel to each other in a second direction perpendicular to the first direction.

15. The semiconductor memory device of claim 1, wherein the memory cell array is overlapped with the at least one sense amplifier in a planar fashion, and the at least one sense amplifier comprises an equalizing unit for equalizing signals of the at least one bit line and the at least one complementary bit line, and a signal amplifying unit, wherein the signal amplifying unit comprises at least one of a decompression unit for decompressing a signal having a lower voltage level among the signals of the at least one bit line and the at least one complementary bit line, and a boosting unit for boosting a signal having a higher voltage level among the signals of the at least one bit line and the at least one complementary bit line.

16. A semiconductor memory device comprising:

a memory cell array that is disposed at a first layer and comprises at least one word line, at least one cell bit line, and at least one memory cell which is disposed in a region where the at least one word line and the at least one cell bit line cross each other;

at least one sense amplifier configured to sense data stored in the at least one memory cell, the at least one sense amplifier being dispose at a second layer different from the first layer and connected to at least one bit line and at least one complementary bit line, the at least one bit line being connected to the at least one cell bit line, at least one output device that is connected to the at least one cell bit line, wherein the bit line is connected to the output device via the cell bit line, wherein the memory cell array is overlapped with the at least one sense amplifier in a planar fashion, the at least one output device is connected to the at least one sense amplifier so as not to be overlapped with the memory cell array in a planar fashion, and the at least one output device transmits a signal of the at least one bit line to an output line.

* * * * *